(12) United States Patent
Paz de Araujo et al.

(10) Patent No.: US 10,797,238 B2
(45) Date of Patent: Oct. 6, 2020

(54) FABRICATING CORRELATED ELECTRON MATERIAL (CEM) DEVICES

(71) Applicant: ARM Ltd., Cambridge (GB)

(72) Inventors: Carlos Alberto Paz de Araujo, Colorado Springs, CO (US); Jolanta Bozena Celinska, Colorado Springs, CO (US); Lucian Shifren, San Jose, CA (US)

(73) Assignee: ARM Ltd., Cambridge (GB)

( * ) Notice: Subject to any disclaimer, the term of this patent is extended or adjusted under 35 U.S.C. 154(b) by 0 days.

(21) Appl. No.: 15/641,124

(22) Filed: Jul. 3, 2017

(65) Prior Publication Data

US 2017/0301859 A1 Oct. 19, 2017

Related U.S. Application Data

(63) Continuation-in-part of application No. 15/046,177, filed on Feb. 17, 2016, and a continuation-in-part of
(Continued)

(51) Int. Cl.
*H01L 45/00* (2006.01)
*C23C 16/40* (2006.01)
(Continued)

(52) U.S. Cl.
CPC ........... *H01L 45/146* (2013.01); *C23C 16/18* (2013.01); *C23C 16/406* (2013.01);
(Continued)

(58) Field of Classification Search
CPC . C23C 16/406; C23C 16/18; C23C 16/45525; H01L 45/146; H01L 45/1233;
(Continued)

(56) References Cited

U.S. PATENT DOCUMENTS 5,030,331 A * 7/1991 Sato .................. C23C 14/06
205/107
5,138,520 A 8/1992 McMillan et al.
(Continued)

FOREIGN PATENT DOCUMENTS

| WO | 2008/058264 A2 | 5/2008 |
| WO | 2008058264 A2 | 5/2008 |
| WO | 2016/094010 A1 | 6/2016 |

OTHER PUBLICATIONS

Kim, "GaN Metal-Semiconductor-Metal Ultraviolet Photodetector with IrO2 Schottky Contact", 2002, p. 4655-4657 (Year: 2002).*
(Continued)

*Primary Examiner* — Gordon Baldwin
*Assistant Examiner* — Christina D McClure
(74) *Attorney, Agent, or Firm* — Berkeley Law & Technology Group, LLP

(57) ABSTRACT

Subject matter disclosed herein may relate to construction of a correlated electron material (CEM) device. In particular embodiments, after formation of a film comprising layers of a transition metal oxide (TMO) material and a dopant, at least a portion of the film may be exposed to an elevated temperature. Exposure of the at least a portion of the film to the elevated temperature may continue until the atomic concentration of the dopant within the film is reduced, which may enable operation of the film as a correlated electron material CEM exhibiting switching of impedance states.

28 Claims, 8 Drawing Sheets

Related U.S. Application Data application No. 15/006,889, filed on Jan. 26, 2016, now Pat. No. 9,627,615, and a continuation-in-part of application No. 15/385,719, filed on Dec. 20, 2016.

(51) Int. Cl.
    *C23C 16/18*           (2006.01)
    *C23C 16/455*        (2006.01)

(52) U.S. Cl.
    CPC ........ *C23C 16/45525* (2013.01); *H01L 45/04* (2013.01); *H01L 45/1233* (2013.01); *H01L 45/1253* (2013.01); *H01L 45/1616* (2013.01); *H01L 45/1641* (2013.01)

(58) Field of Classification Search
    CPC ............. H01L 45/1253; H01L 45/1616; H01L 45/1641; H01L 45/1546
    See application file for complete search history.

(56) References Cited

U.S. PATENT DOCUMENTS

| | | | |
|---|---|---|---|
| 5,533,040 A * | 7/1996 | Zhang | B23K 26/06 257/E21.133 |
| 6,511,718 B1 | 1/2003 | Paz De Araujo et al. | |
| 7,298,640 B2 | 11/2007 | Chen et al. | |
| 7,639,523 B2 | 12/2009 | Celinska et al. | |
| 7,778,063 B2 | 8/2010 | Brubaker et al. | |
| 7,872,900 B2 | 1/2011 | Paz De Araujo et al. | |
| 9,514,814 B1 | 12/2016 | Sandhu et al. | |
| 9,548,118 B1 | 1/2017 | Bhavnagarwala et al. | |
| 9,558,819 B1 | 1/2017 | Aitken et al. | |
| 9,589,636 B1 | 3/2017 | Bhavnagarwala et al. | |
| 9,621,161 B1 | 4/2017 | Das et al. | |
| 9,627,615 B1 | 4/2017 | Reid et al. | |
| 9,660,189 B1 | 5/2017 | Reid et al. | |
| 9,734,895 B2 | 8/2017 | Savanth et al. | |
| 9,735,360 B2 | 8/2017 | Shifren et al. | |
| 9,735,766 B2 | 8/2017 | Shifren et al. | |
| 9,747,982 B1 | 8/2017 | Shifren et al. | |
| 9,748,943 B2 | 8/2017 | Sandhu et al. | |
| 9,755,146 B2 | 9/2017 | Shifren et al. | |
| 9,773,550 B2 | 9/2017 | Bhavnagarwala et al. | |
| 9,786,370 B2 | 10/2017 | Aitken et al. | |
| 9,792,982 B1 | 10/2017 | Sandhu et al. | |
| 9,792,984 B1 | 10/2017 | Bhavnagarwala et al. | |
| 9,805,777 B2 | 10/2017 | Sandhu et al. | |
| 9,851,738 B2 | 12/2017 | Sandhu et al. | |
| 9,871,528 B1 | 1/2018 | Kumar et al. | |
| 9,899,083 B1 | 2/2018 | Rosendale | |
| 9,947,402 B1 | 4/2018 | Bhavnagarwala et al. | |
| 9,972,388 B2 | 5/2018 | Das et al. | |
| 9,978,942 B2 | 5/2018 | Shifren et al. | |
| 9,979,385 B2 | 5/2018 | Sandhu et al. | |
| 9,990,992 B2 | 6/2018 | Bhavnagarwala et al. | |
| 9,997,424 B2 | 6/2018 | Arvin et al. | |
| 9,997,702 B2 | 6/2018 | Reid et al. | |
| 10,002,665 B1 | 6/2018 | Bhargava et al. | |
| 10,002,699 B2 | 6/2018 | Aiki et al. | |
| 10,032,487 B2 | 7/2018 | Shifren et al. | |
| 10,211,398 B2 | 2/2019 | Paz De Araujo et al. | |
| 2004/0072401 A1* | 4/2004 | Iizuka | H01L 27/10811 438/240 |
| 2004/0077182 A1 | 4/2004 | Lim | |
| 2008/0012064 A1 | 1/2008 | Park et al. | |
| 2008/0106925 A1* | 5/2008 | Paz de Araujo | H01L 45/04 365/148 |
| 2008/0106926 A1 | 5/2008 | Brubaker et al. | |
| 2008/0106927 A1 | 5/2008 | Celinska et al. | |
| 2008/0107801 A1 | 5/2008 | Celinska et al. | |
| 2009/0074983 A1 | 3/2009 | Heys | |
| 2010/0085801 A1 | 4/2010 | Sorenson et al. | |
| 2010/0090172 A1 | 4/2010 | Celinska | |
| 2012/0176831 A1* | 7/2012 | Xiao | G11C 13/0007 365/148 |
| 2012/0270393 A1 | 10/2012 | Pore | |
| 2013/0171373 A1* | 7/2013 | Comacho-Lopez | B05D 3/06 427/555 |
| 2013/0285699 A1 | 10/2013 | McWilliams et al. | |
| 2013/0288427 A1 | 10/2013 | Hung | |
| 2014/0030436 A1 | 1/2014 | Knapp | |
| 2014/0061579 A1 | 3/2014 | Wei et al. | |
| 2014/0175355 A1* | 6/2014 | Wang | H01L 45/08 257/2 |
| 2014/0273314 A1 | 9/2014 | Hashim | |
| 2015/0021540 A1* | 1/2015 | Xie | H01L 45/146 257/4 |
| 2015/0179316 A1 | 6/2015 | Hsueh et al. | |
| 2016/0163978 A1 | 6/2016 | Paz De Araujo et al. | |
| 2017/0047116 A1 | 2/2017 | Sandhu et al. | |
| 2017/0069378 A1 | 3/2017 | Shifren et al. | |
| 2017/0092858 A1 | 3/2017 | Shifren | |
| 2017/0147207 A1 | 5/2017 | Hansson et al. | |
| 2017/0213960 A1 | 7/2017 | Paz De Araujo et al. | |
| 2017/0213961 A1 | 7/2017 | Paz de Araujo | |
| 2017/0237001 A1 | 8/2017 | Reid et al. | |
| 2017/0244027 A1 | 8/2017 | Reid et al. | |
| 2017/0244032 A1 | 8/2017 | Reid et al. | |
| 2017/0288675 A1 | 10/2017 | Chandra et al. | |
| 2017/0301859 A1 | 10/2017 | Paz De Araujo et al. | |
| 2018/0013062 A1 | 1/2018 | Reid et al. | |
| 2018/0019394 A1 | 1/2018 | Reid et al. | |
| 2018/0053892 A1 | 2/2018 | Reid et al. | |
| 2018/0095114 A1 | 4/2018 | Bhargave et al. | |
| 2018/0096713 A1 | 4/2018 | Chandra et al. | |
| 2018/0159028 A1 | 6/2018 | Shifren et al. | |
| 2018/0159029 A1 | 6/2018 | Paz De Araujo et al. | |
| 2018/0159031 A1 | 6/2018 | Paz De Araujo et al. | |
| 2018/0175290 A1 | 6/2018 | Reid et al. | |

OTHER PUBLICATIONS

U.S. Appl. No. 15/641,143, filed Jul. 3, 2017, 49 pages.
U.S. Appl. No. 15/006,889, filed Jan. 26, 2016, 57 pages.
U.S. Appl. No. 15/385,719, filed Dec. 20, 2016, 111 pages.
U.S. Appl. No. 15/046,177, filed Feb. 17, 2016, 66 pages.
Notification of Transmittal of the International Search Report and the Written Opinion of the International Searching Authority, or the Declaration, dated Jan. 9, 2019, International Application No. PCT/GB2018/051862, 1 pg.
International Search Report, dated Jan. 9, 2019, International Application No. PCT/GB2018/051862, 8 pgs.
The Written Opinion of the International Searching Authority, or the Declaration, dated Jan. 9, 2019, International Application No. PCT/GB2018/051862, 12 pgs.
U.S. Appl. No. 15/463,546, filed Apr. 9, 2017, 63 pages.
PCT/GB2017/050396: International Search Report and Written Opinion, dated May 8, 2017, 16 pages.
PCT/GB2017/050184: International Search Report and Written Opinion, dated Apr. 7, 2017, 20 pages.
PCT/GB2017/050182: International Search Report and Written Opinion, dated Apr. 7, 2017, 14 pages.
PCT/GB2018/051862: Partial Search Report, dated Nov. 16, 2018, 15 pages.
U.S. Appl. No. 15/006,889: Request under Rule 48 correcting inventorship, Feb. 17, 2016, 9 pages.
U.S. Appl. No. 15/006,889: Filing Receipt, Feb. 26, 2016, 3 pages.
U.S. Appl. No. 15/006,889: Requirement for Restriction/Election, dated Aug. 1, 2016, 5 pages.
U.S. Appl. No. 15/006,889: Response to Election/Restriction and Amendment, dated Sep. 27, 2016, 7 pages.
U.S. Appl. No. 15/006,889: Non-Final Rejection, dated Oct. 7, 2016, 9 pages.
U.S. Appl. No. 15/006,889: Amendment/Req. Reconsideration—After Non-Final Rejection, dated Nov. 3, 2016, 8 pages.
U.S. Appl. No. 15/006,889: Notice of Allowance and Fees Due, dated Dec. 8, 2016, 5 pages.
U.S. Appl. No. 15/006,889: Issue Fee Payment, Mar. 6, 2017, 1 page.

(56) References Cited

OTHER PUBLICATIONS

U.S. Appl. No. 15/006,889: Issue Notification, Mar. 29, 2017, 1 page.
U.S. Appl. No. 15/385,719: Filing Receipt, Dec. 29, 2016, 3 pages.
U.S. Appl. No. 15/385,719: Notice of Publication, Jul. 27, 2017, 1 page.
U.S. Appl. No. 15/939,160, filed Mar. 28, 2018, 73 pages.
U.S. Appl. No. 15/939,160: Filing Receipt, Apr. 25, 2018, 4 pages.
U.S. Appl. No. 15/046,177: Filing Receipt, Mar. 3, 2016, 3 pages.
U.S. Appl. No. 15/046,177: Requirement for Restriction/Election, dated Jun. 30, 2017, 6 pages.
U.S. Appl. No. 15/046,177: Response to Election/Restriction and Amendments, dated Aug. 1, 2017, 8 pages.
U.S. Appl. No. 15/046,177: Notice of Publication, Aug. 17, 2017, 1 page.
U.S. Appl. No. 15/046,177: Non-Final Rejection, dated Feb. 9, 2018, 24 pages.
U.S. Appl. No. 15/463,546: Preliminary Amendment, dated Apr. 9, 2017, 9 pages.
U.S. Appl. No. 15/463,546: Filing Receipt, Mar. 27, 2017, 3 pages.
U.S. Appl. No. 15/463,546: Notice of Publication, Jul. 27, 2017, 1 page.
U.S. Appl. No. 15/641,143: Filing Receipt, Jul. 12, 2017, 3 pages.
U.S. Appl. No. 15/641,143: Notice to File Corrected Application Papers, Jul. 12, 2017, 2 pages.
U.S. Appl. No. 15/641,143: Applicant Response to Pre-Exam Formalities Notice, Aug. 15, 2017, 11 pages.
U.S. Appl. No. 15/641,143: Application Data Sheet to update/correct info and Request for Corrected Filing Receipt, Aug. 15, 2017, 7 pages.
U.S. Appl. No. 15/641,143: Filing Receipt, Aug. 17, 2017, 3 pages.
U.S. Appl. No. 15/641,143: Non-Final Rejection, dated Nov. 29, 2017, 13 pages.
U.S. Appl. No. 15/641,143: Amendment/Req. Reconsideration-After Non-Final Reject, 18 pages.
Communication pursuant to Rules 161(1) and 162 EPC, dated Sep. 4, 2018, International Patent Application No. 17707391.3, 3 pgs.
Response to Communication pursuant to Rules 161(1) and 162 EPC, Filed Mar. 13, 2019, International Patent Application No. 17707391.3, 14 pgs.
Acknowledgement of Receipt for Response to Communication pursuant to Rules 161(1) and 162 EPC, Filed Mar. 13, 2019, International Patent Application No. 17707391.3, 1 pg.
Communication pursuant to Rules 161(1) and 162 EPC, dated Sep. 4, 2018, International Patent Application No. 17704524.2, 3 pgs.
Response to Communication pursuant to Rules 161(1) and 162 EPC, Filed Mar. 13, 2019, International Patent Application No. 17704524.2, 21 pgs.
Acknowledgement of Receipt for Response to Communication pursuant to Rules 161(1) and 162 EPC, Filed Mar. 13, 2019, International Patent Application No. 17704524.2, 1 pg.
Office Action, U.S. Appl. No. 15/046,177, dated Apr. 2, 2020, 46 Pages.
Response to Final Office Action, U.S. Appl. No. 15/939,160, filed Mar. 30, 2020, 21 Pages.
Advisory Action, U.S. Appl. No. 15/939,160, dated Apr. 9, 2020, 11 Pages.
U.S. Appl. No. 15/046,177, filed Feb. 17, 2016, 71 pgs.
Response to Non-Final Office Action filed Jun. 11, 2018, U.S. Appl. No. 15/046,177, 19 pgs.
Electronic Terminal Disclaimer filed Jun. 11, 2018, U.S. Appl. No. 15/046,177, 6 pgs.
Final Office Action dated Aug. 6, 2018, U.S. Appl. No. 15/046,177, 24 pgs.
Response to Final Office Action and AFCP Request filed Oct. 9, 2018, U.S. Appl. No. 15/046,177, 24 pgs.
Advisory Action dated Jan. 16, 2019, U.S. Appl. No. 15/046,177, 16 pgs.
Request for Continued Examination filed Feb. 5, 2019, U.S. Appl. No. 15/046,177, 26 pgs.
Non-Final Office Action dated Jun. 24, 2019, U.S. Appl. No. 15/046,177, 37 pgs.
Response to Non-Final Office Action filed Sep. 24, 2019, U.S. Appl. No. 15/046,177, 26 pgs.
Final Office Action dated Nov. 25, 2019, U.S. Appl. No. 15/046,177, 31 pgs.
Response to Final Office Action filed Jan. 27, 2020, U.S. Appl. No. 15/046,177, 25 pgs.
Advisory Action dated Feb. 6, 2020, U.S. Appl. No. 15/046,177, 7 pgs.
Request for Continued Examination filed Feb. 25, 2020, U.S. Appl. No. 15/046,177, 30 pgs.
U.S. Appl. No. 15/006,889, filed Jan. 26, 2016, 62 pgs.
Non-Final Office Action dated Oct. 18, 2017, U.S. Appl. No. 15/463,546, 17 pgs.
Response to Non-Final Office Action filed Jan. 17, 2018, U.S. Appl. No. 15/463,546, 9 pgs.
Notice of Allowance dated Mar. 23, 2018, U.S. Appl. No. 15/463,546, 5 pgs.
Issue Fee Payment and Rule 312 Amendment filed Jun. 21, 2018, U.S. Appl. No. 15/463,546, 9 pgs.
Response to Rule 312 Amendment dated Jun. 28, 2018, U.S. Appl. No. 15/463,546, 2 pgs.
Issue Notification dated Jul. 11, 2018, U.S. Appl. No. 15/463,546, 1 pg.
U.S. Appl. No. 15/385,719, filed Dec. 20, 2016, 116 pgs.
Restriction Requirement dated Jun. 21, 2018, U.S. Appl. No. 15/385,719, 11 pgs.
Response to Restriction Requirement filed Aug. 21, 2018, U.S. Appl. No. 15/385,719, 20 pgs.
Non-Final Office Action dated Mar. 5, 2019, U.S. Appl. No. 15/385,719, 68 pgs.
Response to Non-Final Office Action filed Jun. 4, 2019, U.S. Appl. No. 15/385,719, 43 pgs.
Final Office Action dated Jul. 24, 2019, U.S. Appl. No. 15/385,719, 57 pgs.
Response to Final Office Action filed Sep. 24, 2019, U.S. Appl. No. 15/385,719, 39 pgs.
Advisory Action dated Oct. 15, 2019, U.S. Appl. No. 15/385,719, 5 pgs.
Request for Continued Examination filed Oct. 24, 2019, U.S. Appl. No. 15/385,719, 40 pgs.
Non-Final Office Action dated Nov. 18, 2019, U.S. Appl. No. 15/385,719, 42 pgs.
Response to Non-Final Office Action filed Feb. 18, 2020, U.S. Appl. No. 15/385,719, 50 pgs.
Applicant Initiated Interview Summary dated Feb. 24, 2020, U.S. Appl. No. 15/385,719, 5 pgs.
Notice of Publication mailed Aug. 2, 2018, U.S. Appl. No. 15/939,160, 1 pg.
Non-Final Office Action dated Aug. 8, 2019, U.S. Appl. No. 15/939,160, 45 pgs.
Response to Non-Final Office Action filed Nov. 8, 2019, U.S. Appl. No. 15/939,160, 25 pgs.
Final Office Action dated Jan. 31, 2020, U.S. Appl. No. 15/939,160, 34 pgs.
Non-Final Office Action dated May 13, 2020, U.S. Appl. No. 15/939,160, 23 pgs.
Final Office Action dated Apr. 30, 2020, U.S. Appl. No. 15/385,719, 69 pgs.
Response to Final Office Action filed Jun. 29, 2020, U.S. Appl. No. 15/385,719, 41 pgs.
Examination Report under Section 18(3) dated Jun. 18, 2020; Patent Application No. GB1813620.0, 6 pgs.

\* cited by examiner

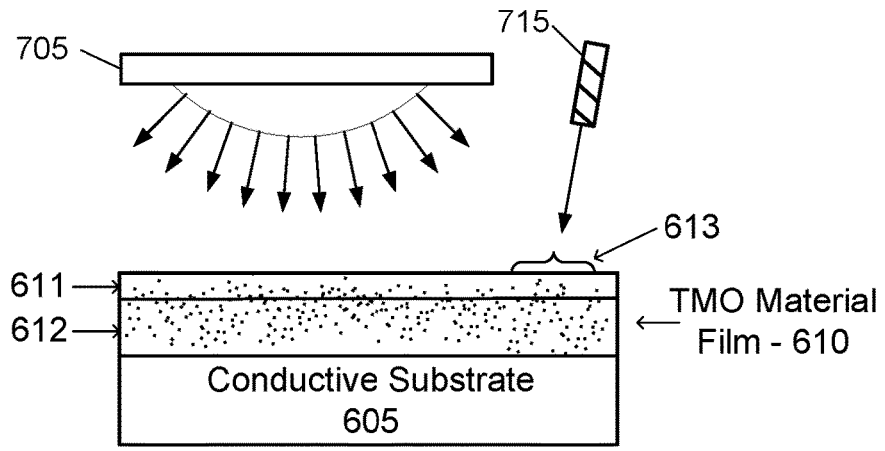

805 — Deposit a film of a TMO material on a conductive substrate, the TMO material comprising a first atomic concentration of an extrinsic ligand

810 — Expose at least a portion of the film of the TMO material, in the chamber, to an elevated temperature to reduce the concentration of the extrinsic ligand until at least a portion of the film of the transition metal oxide material is capable of switching between a relatively conductive state and a substantially dissimilar insulative state

*FIG. 8*

FABRICATING CORRELATED ELECTRON MATERIAL (CEM) DEVICES

CROSS-REFERENCE TO RELATED APPLICATIONS

This application is a Continuation-In-Part of U.S. application Ser. No. 15/046,177, titled "FABRICATION OF CORRELATED ELECTRON MATERIAL DEVICES COMPRISING NITROGEN," filed Feb. 17, 2016, and a Continuation-In-Part of U.S. application Ser. No. 15/006,889, titled "FABRICATION OF CORRELATED ELECTRON MATERIAL DEVICES," filed Jan. 26, 2016, and a Continuation-In-Part of U.S. application Ser. No. 15/385,719, titled "FABRICATION AND OPERATION OF CORRELATED ELECTRON MATERIAL DEVICES," filed Dec. 20, 2016, all of which are assigned to the assignee hereof and are expressly incorporated herein by reference in their entirety.

This application is related to U.S. patent application Ser. No. 15/641,143, now U.S. Pat. No. 10,211,398, titled "METHOD FOR THE MANUFACTURE OF A CORRELATED ELECTRON MATERIAL DEVICE," filed Jul. 3, 2017, and incorporated herein by reference in its entirety.

BACKGROUND

Field

This disclosure relates to correlated electron material (CEM) devices, and may relate, more particularly, to approaches for fabricating CEM devices, such as may be used in switches, memory circuits, and so forth, which may transition between impedance states.

Information

Integrated circuit devices, such as electronic switching devices, for example, may be found in numerous types of electronic devices. For example, memory and/or logic devices may incorporate electronic switches suitable for use in computers, digital cameras, smart phones, computing devices, wearable electronic devices, and so forth. Factors that may relate to electronic switching devices, which may be of interest to a designer in considering whether an electronic switching device is suitable for particular applications, may include physical size, storage density, operating voltages, impedance ranges, switching speed, and/or power consumption, for example. Other factors may include, for example, cost and/or ease of manufacture, scalability, and/or reliability.

However, conventional fabrication techniques, which may be well suited for certain types of memory and/or logic devices, may not be suitable for use in fabricating devices that utilize correlated electron materials. For example, in some instances, a CEM exhibiting desirable impedance characteristics may be doped with a particular dopant species. However, achieving desired atomic concentrations of one or more dopants in a finished CEM film may be problematic.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, claimed subject matter may best be understood by reference to the following detailed description if read with the accompanying drawings in which:

FIG. 7 is a diagram showing a heat source to bring about an elevated temperature of a TMO material film according to an embodiment 700; and FIGS. 8-9 are flowcharts for additional methods of constructing a CEM device, according to embodiments.

Figure 1A:
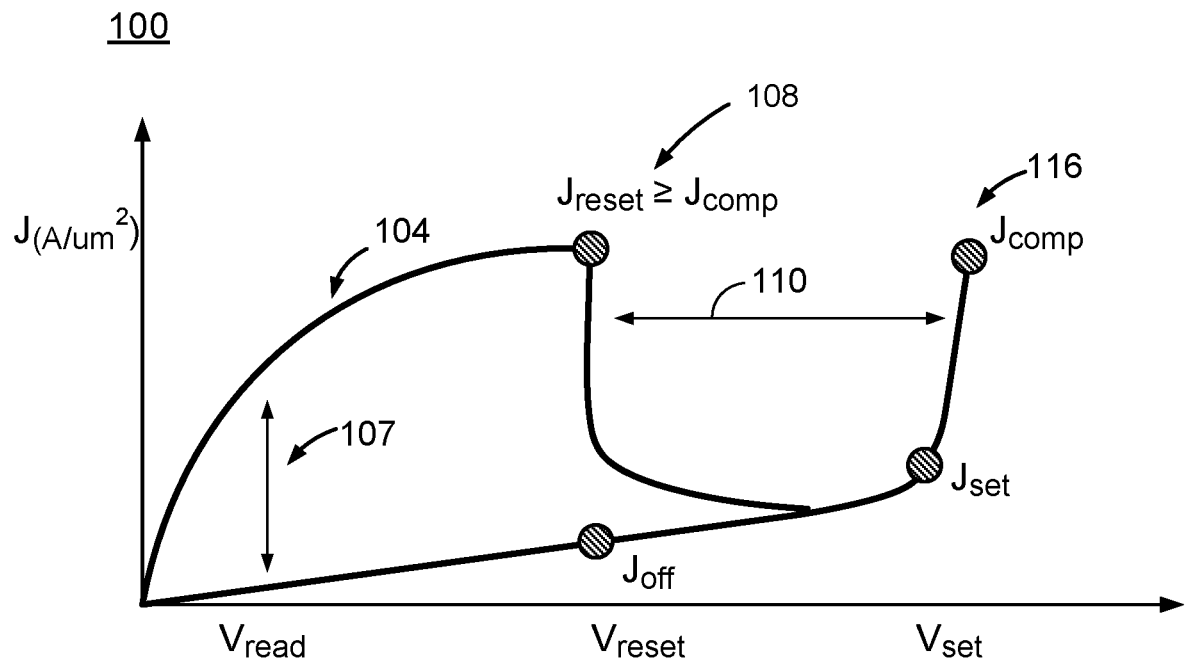
FIG. 1A is an illustration of an embodiment of a current density versus voltage profile of a device formed from a correlated electron material.

Reference is made in the following detailed description to accompanying drawings, which form a part hereof, wherein like numerals may designate like parts throughout that are corresponding and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim. It should also be noted that directions and/or references, for example, such as up, down, top, bottom, and so on, may be used to facilitate discussion of drawings and are not intended to restrict application of claimed subject matter. Therefore, the following detailed description is not to be taken to limit claimed subject matter and/or equivalents.

DETAILED DESCRIPTION

References throughout this specification to one implementation, an implementation, one embodiment, an embodiment, and/or the like means that a particular feature, structure, characteristic, and/or the like described in relation to a particular implementation and/or embodiment is included in at least one implementation and/or embodiment of claimed subject matter. Thus, appearances of such phrases, for example, in various places throughout this specification are not necessarily intended to refer to the same implementation and/or embodiment or to any one particular implementation and/or embodiment. Furthermore, it is to be understood that particular features, structures, characteristics, and/or the like described are capable of being combined in various ways in one or more implementations and/or embodiments and, therefore, are within intended claim scope. In general, of course, as has been the case for the specification of a patent application, these and other issues have a potential to vary in a particular context of usage. In other words, throughout the disclosure, particular context of description and/or usage provides helpful guidance regarding reasonable inferences to be drawn; however, likewise, "in this context" in general without further qualification refers to the context of the present disclosure.

Particular aspects of the present disclosure describe methods and/or processes for preparing and/or fabricating correlated electron materials (CEMs) films to form, for example, CEM switches, such as may be utilized to form a correlated electron random access memory (CERAM), and/or logic devices, for example. CEMs, which may be utilized in the construction of CERAM devices and CEM switches, for example, may also comprise a wide range of other electronic circuit types, such as, for example, memory controllers, memory arrays, filter circuits, data converters, optical instruments, phase locked loop circuits, microwave and millimeter wave transceivers, and so forth, although claimed subject matter is not limited in scope in these respects.

In this context, a CEM switch, for example, may exhibit a substantially rapid conductor-to-insulator transition, which may be enabled, at least in part, by electron correlations rather than solid state structural phase changes, such as in response to a change from a crystalline to an amorphous state, for example, in a phase change memory device or, in another example, formation of filaments in certain resistive RAM devices. In one aspect, a substantially rapid conductor-to-insulator transition in a CEM device may be responsive to a quantum mechanical phenomenon, in contrast to melting/solidification or filament formation, for example, in phase change and certain resistive RAM devices. Such quantum mechanical transitions between relatively conductive and relatively insulative states, and/or between a first impedance state and a second, dissimilar impedance state, for example, in a CEM device may be understood in any one of several aspects. As used herein, the terms "relatively conductive state," "relatively lower impedance state," and/or "metal state" may be interchangeable, and/or may, at times, be referred to as a "relatively conductive/lower impedance state." Likewise, the terms "relatively insulative state" and "relatively higher impedance state" may be used interchangeably herein, and/or may, at times, be referred to as a "relatively insulative/higher impedance state."

In an aspect, a quantum mechanical transition of a CEM between a relatively insulative/higher impedance state and a relatively conductive/lower impedance state, wherein the relatively conductive/lower impedance state is substantially dissimilar from the insulated/higher impedance state, may be understood in terms of a Mott transition. In accordance with a Mott transition, a material may switch between a relatively insulative/higher impedance state and a relatively conductive/lower impedance state if a Mott transition condition occurs. The Mott criteria may be defined by $(n_c)^{1/3}a \approx 0.26$, wherein $n_c$ denotes a concentration of electrons, and wherein "a" denotes the Bohr radius. If a threshold carrier concentration is achieved, such that the Mott criteria is met, the Mott transition is believed to occur. Responsive to the Mott transition occurring, the state of the CEM device changes from a relatively higher resistance/higher capacitance state (e.g., an insulative/higher impedance state) to a relatively lower resistance/lower capacitance state (e.g., a conductive/lower impedance state) that is substantially dissimilar from the higher resistance/higher capacitance state.

In another aspect, a Mott transition may be controlled by a localization of electrons. If carriers, such as electrons, for example, are localized, a strong coulomb interaction between the carriers may split the bands of the CEM to enable a relatively insulative (relatively higher impedance) state. If electrons are no longer localized, a weak coulomb interaction may dominate, which may give rise to a removal of band splitting, which may, in turn, enable a metal (conductive) band (relatively lower impedance state) that is substantially dissimilar from the relatively higher impedance state.

Further, in an embodiment, switching from a relatively insulative/higher impedance state to a substantially dissimilar and relatively conductive/lower impedance state may enable a change in capacitance in addition to a change in resistance. For example, a CEM device may exhibit a variable resistance together with a property of variable capacitance. In other words, impedance characteristics of a CEM device may include both resistive and capacitive components. For example, in a metal state, a CEM device may comprise a relatively low electric field that may approach zero, and therefore may exhibit a substantially low capacitance, which may likewise approach zero.

Similarly, in a relatively insulative/higher impedance state, which may be brought about by a higher density of bound or correlated electrons, an external electric field may be capable of penetrating the CEM and, therefore, the CEM may exhibit higher capacitance based, at least in part, on additional charges stored within the CEM. Thus, for example, a transition from a relatively insulative/higher impedance state to a substantially dissimilar and relatively conductive/lower impedance state in a CEM device may result in changes in both resistance and capacitance, at least in particular embodiments. Such a transition may give rise to additional measurable phenomena, and claimed subject matter is not limited in this respect.

In an embodiment, a device formed from a CEM may exhibit switching of impedance states responsive to a Mott-transition in a portion, such as a major portion, of the volume of a CEM-based device. In an embodiment, a CEM may form a "bulk switch." As used herein, the term "bulk switch" refers to at least a majority volume of a CEM switching an impedance state of the device, such as in response to a Mott-transition. For example, in an embodiment, substantially all CEM of a device may switch between a relatively insulative/higher impedance state and a relatively conductive/lower impedance state (e.g., a "metal" or "metallic state") responsive to a Mott transition, or from a relatively conductive/lower impedance state to a relatively insulative/higher impedance state responsive to a reverse Mott transition.

In implementations, a CEM may comprise one or more "d-block" elements or compounds of "d-block" elements. The CEM may, for example, comprise one or more transition metals or transition metal compounds, and, in particular, one or more transition metal oxides (TMOs). CEM devices may also be implemented utilizing one or more "f-block" elements or compounds of "f-block" elements. A CEM may comprise one or more rare earth elements, oxides of rare earth elements, oxides comprising one or more rare earth transition metals, perovskites, yttrium, and/or ytterbium, or any other compounds comprising metals from the lanthanide or actinide series of the periodic table of the elements, for example, and claimed subject matter is not limited in scope in this respect. A CEM may additionally comprise a dopant, such as a carbon-containing dopant and/or a nitrogen-containing dopant, wherein the atomic concentration (e.g., of carbon or nitrogen) comprise between about 0.1% to about 15.0%. As the term is used herein, a "d-block" element means an element comprising scandium (Sc), titanium (Ti), vanadium (V), chromium (Cr), manganese (Mn), iron (Fe), cobalt (Co), nickel (Ni), copper (Cu), zinc (Zn), yttrium (Y), zirconium (Zr), niobium (Nb), molybdenum (Mo), technetium (Tc), ruthenium (Ru), rhodium (Rh), palladium (Pd), silver (Ag), cadmium (Cd), hafnium (Hf), tantalum (Ta), tungsten (W), rhenium (Re), osmium (Os), iridium (Jr), platinum (Pt), gold (Au), mercury (Hg), rutherfordium (Rf), dubnium (Db), seaborgium (Sg), bohrium (Bh), hassium (Hs), meitnerium (Mt), darmstadtium (Ds), roentgenium (Rg) or copernicium (Cn), or any combination thereof. A CEM formed from or comprising an "f-block" element of the periodic table of the elements means a CEM comprising a metal or metal oxide, wherein the metal is from the f-block of the periodic table of the elements, which may include lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), actinium (Ac), thorium (Th), protactinium (Pa), uranium (U), neptunium (Np), plutonium (Pu), americium (Am), berkelium (Bk), californium (Cf), einsteinium (Es), fermium (Fm), mendelevium (Md), nobelium (No) or lawrencium (Lr), or any combination thereof.

FIG. 1A is an illustration of an embodiment 100 of a current density versus voltage profile of a device formed from a correlated electron material. Based, at least in part, on a voltage applied to terminals of a CEM device, for example, during a "write operation," the CEM device may be placed into a relatively low-impedance state or a relatively high-impedance state. For example, application of a voltage $V_{set}$ and a current density $J_{set}$ may enable a transition of the CEM device to a relatively low-impedance state. Conversely, application of a voltage $V_{reset}$ and a current density $J_{reset}$ may enable a transition of the CEM device to a relatively high-impedance state. As shown in FIG. 1A, reference designator 110 illustrates the voltage range that may separate $V_{set}$ from $V_{reset}$. Following placement of the CEM device into a high-impedance state or into a low-impedance state, the particular state of the CEM device may be detected by application of a voltage $V_{read}$ (e.g., during a read operation) and detection of a current or current density at terminals of the CEM device (e.g., utilizing read window 107).

According to an embodiment, the CEM device characterized in FIG. 1A may comprise any transition metal oxide (TMO), such as, for example, perovskites, Mott insulators, charge exchange insulators, and Anderson disorder insulators, as well as any compound or material comprising a d-block or f-block element. In one aspect, the CEM device of FIG. 1A may comprise other types of TMO variable impedance materials, though it should be understood that these are exemplary only and are not intended to limit claimed subject matter. Nickel oxide (NiO) is disclosed as one particular TMO material. NiO materials discussed herein may be doped with extrinsic ligands, such as carbon-containing materials (e.g., carbonyl (CO)), or nitrogen-containing materials, such as ammonia ($NH_3$), for example, which may establish and/or stabilize variable impedance properties and/or enable a P-type operation in which a CEM may be more conductive when placed into a low-impedance state. Thus, in another particular example, NiO doped with extrinsic ligands may be expressed as $NiO:L_x$, where $L_x$ may indicate a ligand element or compound and x may indicate a number of units of the ligand for one unit of NiO. A value of x may be determined for any specific ligand and any specific combination of ligand with NiO or with any other transition metal compound simply by balancing valences. Other dopant ligands, which may enable or increase conductivity in a low-impedance state in addition to carbonyl may include: nitrosyl (NO), an isocyanide (RNC wherein R is H, $C_1$-$C_6$ alkyl or $C_6$-$C_{10}$ aryl), a phosphine ($R_3P$ wherein R is $C_1$-$C_6$ alkyl or $C_6$-$C_{10}$ aryl) for example, triphenylphosphine ($PPh_3$), an alkyne (e.g. ethyne) or phenanthroline ($C_{12}H_8N_2$), bipyridine ($C_{10}H_8N_2$), ethylenediamine ($C_2H_4(NH_2)_2$), acetonitrile ($CH_3CN$), fluoride (F), chloride (Cl), bromide (Br), cyanide (CN), sulfur (S), carbon (C), and others.

In this context, a "P-type" doped CEM as referred to herein means a first type of CEM comprising a particular molecular dopant that exhibits increased electrical conductivity, relative to an undoped CEM, when the CEM is operated in a relatively low-impedance state. Introduction of a substitutional ligand, such as CO and $NH_3$, may operate to enhance the P-type nature of a NiO-based CEM, for example. Accordingly, an attribute of P-type operation of a CEM may include, at least in particular embodiments, an ability to tailor or customize electrical conductivity of a CEM, operated in a relatively low-impedance state, by controlling an atomic concentration of a P-type dopant in a CEM. In particular embodiments, an increased atomic concentration of a P-type dopant may enable increased electrical conductivity of a CEM, although claimed subject matter is not limited in this respect. In particular embodiments, changes in atomic concentration or atomic percentage of P-type dopant in a CEM device may be observed in the characteristics of region 104 of FIG. 1A, as described herein, wherein an increase in P-type dopant brings about a steeper (e.g., more positive) slope of region 104 to indicate higher conductivity.

In another embodiment, the CEM device represented by the current density versus voltage profile of FIG. 1A, may comprise other TMO variable impedance materials, such as nitrogen-containing ligands, though it should be understood that these are exemplary only and are not intended to limit claimed subject matter. NiO, for example, may be doped with substitutional nitrogen-containing ligands, which may stabilize variable impedance properties in a manner similar to stabilization of variable impedance properties brought about by use of carbon or a carbon-containing dopant species (e.g., carbonyl). In particular, NiO variable impedance materials disclosed herein may include nitrogen-containing molecules of the form $C_xH_yN_z$ (wherein x≥0, y≥0, z≥0, and wherein at least x, y, or z comprise values>0) such as: ammonia ($NH_3$), cyano ($CN^-$), azide ion ($N_3^-$) ethylene diamine ($C_2H_8N_2$), phen(1,10-phenantroline) ($C_{12}H_8N_2$), 2,2'bipyridine ($C_{10}H_8N_2$), ethylenediamine (($C_2H_4(NH_2)_2$), pyridine ($C_5H_5N$), acetonitrile ($CH_3CN$), and cyanosulfanides such as thiocyanate ($NCS^-$), for example. NiO variable impedance materials disclosed herein may include members of an oxynitride family ($N_xO_y$, wherein x and y comprise whole numbers, and wherein x≥0 and y≥0 and at least x or y comprise values>0), which may include, for example, nitric oxide (NO), nitrous oxide (N$_2$O), nitrogen dioxide (NO$_2$), or precursors with an NO$_3^-$ ligand.

In accordance with FIG. 1A, if a sufficient bias voltage is applied (e.g., exceeding a band-splitting potential) and the aforementioned Mott condition is satisfied (e.g., injected electron holes are of a population comparable to a population of electrons in a switching region, for example), a CEM device may switch between a relatively low-impedance state and a relatively high-impedance state, for example, responsive to a Mott transition. This may correspond to point 108 (V$_{reset}$) of the voltage versus current density profile of FIG. 1A. At, or suitably near this point, electrons are no longer screened and become localized near the metal ion. This correlation may result in a strong electron-to-electron interaction potential, which may operate to split the bands to form a relatively high-impedance material. If the CEM device comprises a relatively high-impedance state, current may be generated by transportation of electron holes. Consequently, if a threshold voltage is applied across terminals of the CEM device, electrons may be injected into a metal-insulator-metal (MIM) diode over the potential barrier of the MIM device. In certain embodiments, injection of a threshold current of electrons, at a threshold potential applied across terminals of a CEM device, may perform a "set" operation, which places the CEM device into a low-impedance state. In a low-impedance state, an increase in electrons may screen incoming electrons and remove a localization of electrons, which may operate to collapse the band-splitting potential, thereby giving rise to the low-impedance state.

According to an embodiment, current in a CEM device may be controlled by an externally applied "compliance" condition, which may be determined at least partially on the basis of an applied external current, which may be limited during a write operation, for example, to place the CEM device into a relatively high-impedance state. This externally applied compliance current may, in some embodiments, also set a condition of a current density for a subsequent reset operation to place the CEM device into a relatively high-impedance state. As shown in the particular implementation of FIG. 1A, a voltage V$_{set}$ may be applied during a write operation to give rise to a current density J$_{comp}$, such as at point 116, to place the CEM device into a relatively low-impedance state, which may determine a compliance condition for placing the CEM device into a relatively high-impedance state in a subsequent write operation. As shown in FIG. 1A, a CEM device may be subsequently placed into a relatively high-impedance state by application of an externally applied voltage (V$_{reset}$), which may give rise to a current density J$_{reset}$≥J$_{comp}$ at a voltage referenced by 108 in FIG. 1A.

In embodiments, compliance may set a number of electrons in a CEM device that may be "captured" by holes for the Mott transition. In other words, a current applied in a write operation to place a CEM device into a relatively low-impedance state may determine a number of holes to be injected to the CEM device for subsequently transitioning the CEM device to a relatively high-impedance state.

As pointed out above, a reset condition may occur in response to a Mott transition at point 108. As pointed out above, such a Mott transition may give rise to a condition in a CEM device in which a concentration of electrons n approximately equals, or becomes at least comparable to, a concentration of electron holes p. This condition may be modeled according to expression (1) as follows:

$$\lambda_{TF} n^{\frac{1}{3}} = C \sim 0.26 \qquad (1)$$
$$n = \left(\frac{C}{\lambda_{TF}}\right)^3$$

In expression (1), $\lambda_{TF}$ corresponds to a Thomas Fermi screening length, and C is a constant.

According to an embodiment, a current or current density in region 104 of the voltage versus current density profile shown in FIG. 1A, may exist in response to injection of holes from a voltage signal applied across terminals of a CEM device, which may correspond to P-type operation of the CEM device. Here, injection of holes may meet a Mott criterion for the low-impedance state to high-impedance state transition at current I$_{MI}$ as a threshold voltage V$_{MI}$ is applied across terminals of a CEM device. This may be modeled according to expression (2) as follows:

$$I_{MI}(V_{MI}) = \frac{dQ(V_{MI})}{dt} \approx \frac{Q(V_{MI})}{t} \qquad (2)$$
$$Q(V_{MI}) = qn(V_{MI})$$

In expression (2), Q(V$_{MI}$) corresponds to the charged injected (holes or electrons) and is a function of an applied voltage. Injection of electrons and/or holes to enable a Mott transition may occur between bands and in response to threshold voltage V$_{MI}$, and threshold current I$_{MI}$. By equating electron concentration n with a charge concentration to give rise to a Mott transition by holes injected by I$_{MI}$ in expression (2) according to expression (1), a dependency of such a threshold voltage V$_{MI}$ on Thomas Fermi screening length $\lambda_{TF}$ may be modeled substantially in accordance with expression (3), as follows:

$$I_{MI}(V_{MI}) = \frac{Q(V_{MI})}{t} = \frac{qn(V_{MI})}{t} = \frac{q}{t}\left(\frac{C}{\lambda_{TF}}\right)^3 \qquad (3)$$
$$J_{reset}(V_{MI}) = J_{MI}(V_{MI}) = \frac{I_{MI}(V_{MI})}{A_{CEM}} = \frac{q}{A_{CEM}t}\left(\frac{C}{\lambda_{TF}}\right)^3$$

In expression (3), A$_{CEM}$ corresponds to a cross-sectional area of a CEM device; and J$_{reset}$(V$_{MI}$) may represent a current density through the CEM device to be applied to the CEM device at a threshold voltage V$_{MI}$, which may place the CEM device into a relatively high-impedance state.

According to an embodiment, a CEM device, which may be utilized to form a CEM switch, a CERAM memory device, or a variety of other electronic devices comprising one or more correlated electron materials, may be placed into a relatively low-impedance state, such as by transitioning from a relatively high-impedance state, for example, via injection of a sufficient quantity of electrons to satisfy a Mott criteria. In transitioning a CEM device to a relatively low-impedance state, if enough electrons are injected and the potential across the terminals of the CEM device overcomes a threshold switching potential (e.g., V$_{set}$), injected electrons may begin to screen. As previously mentioned, screening may operate to unlocalize double-occupied electrons to collapse the band-splitting potential, thereby bringing about a relatively low-impedance state.

In particular embodiments, changes in impedance states of CEM devices, such as changes from a low-impedance state to a substantially dissimilar high-impedance state, for example, may be brought about by "back-donation" of electrons of compounds comprising $Ni_xO_y$, (wherein the subscripts "x" and "y" comprise whole numbers). As the term is used herein, "back-donation" refers to a supplying of one or more electrons (e.g., increased electron density) to a transition metal, transition metal oxide, or any combination thereof (e.g., to an atomic orbital of a metal), by an adjacent molecule of a lattice structure, such as a ligand or dopant. Back-donation also refers to reversible donation of electrons (e.g., an increase electron density) from a metal atom to an unoccupied n-antibonding orbital on a ligand or dopant. Back-donation may permit a transition metal, transition metal compound, transition metal oxide, or a combination thereof, to maintain an ionization state that is favorable to electrical conduction under an influence of an applied voltage. In certain embodiments, back-donation in a CEM, for example, may occur responsive to use of carbon (C), carbonyl (CO), or a nitrogen-containing dopant species, such as ammonia ($NH_3$), ethylene diamine ($C_2H_8N_2$), or members of an oxynitride family ($N_xO_y$), for example, which may permit a CEM to exhibit a property in which electrons are controllably, and reversibly, "donated" to a conduction band of the transition metal or transition metal oxide, such as nickel, for example, during operation of a device or circuit comprising a CEM. Back donation may be reversed, for example, in a nickel oxide material (e.g., NiO:CO or NiO:$NH_3$), thereby permitting the nickel oxide material to switch to exhibiting a substantially dissimilar impedance property, such as a high-impedance property, during device operation.

Thus, in this context, an electron back-donating dopant refers to a material that enables a TMO material film to exhibit an impedance switching property, such as switching from a first impedance state to a substantially dissimilar second impedance state (e.g., from a relatively low impedance state to a relatively high impedance state, or vice versa) based, at least in part, on influence of an applied voltage to control donation of electrons, and reversal of the electron donation, to and from a conduction band of the CEM.

In some embodiments, by way of back-donation, a CEM switch comprising a transition metal, transition metal compound, or transition metal oxide, may exhibit low-impedance properties if the transition metal, such as nickel, for example, is placed into an oxidation state of 2+ (e.g., $Ni^{2+}$ in a material, such as NiO:CO or NiO:$NH_3$). Conversely, electron back-donation may be reversed if a transition metal, such as nickel, for example, is placed into an oxidation state of 1+ or 3+. Accordingly, during operation of a CEM device, back-donation may result in "disproportionation," which may comprise substantially simultaneous oxidation and reduction reactions, substantially in accordance with expression (4), below:

$$2Ni^{2+} \rightarrow Ni^{1+} + Ni^{3+} \quad (4)$$

Such disproportionation, in this instance, refers to formation of nickel ions as $Ni^{1+} + Ni^{3+}$ as shown in expression (4), which may bring about, for example, a relatively high-impedance state during operation of the CEM device. In an embodiment, a dopant such as carbon or a carbon-containing ligand (e.g., carbonyl (CO)) or a nitrogen-containing ligand, such as an ammonia molecule ($NH_3$), may permit sharing of electrons during operation of a CEM device to give rise to the disproportionation reaction of expression (4), and its reversal, substantially in accordance with expression (5), below:

$$Ni^{1+} + Ni^{3+} \rightarrow 2Ni^{2+} \quad (5)$$

As previously mentioned, reversal of the disproportionation reaction, as shown in expression (5), permits a nickel-based CEM to return to a relatively low-impedance state.

In embodiments, depending on a molecular concentration of NiO:CO or NiO:$NH_3$, for example, which may vary from values approximately in the range of an atomic percentage of 0.1% to 15.0%, $V_{reset}$ and $V_{set}$, as shown in FIG. 1A, may vary from about 1.0 V to about 10.0 V, subject to the condition that $V_{set} \geq V_{reset}$. For example, in one possible embodiment, $V_{reset}$ may occur at a voltage approximately in the range of 0.1 V to 1.0 V, and $V_{set}$ may occur at a voltage approximately in the range of 1.0 V to 2.0 V, for example. It should be noted, however, that variations in $V_{set}$ and $V_{reset}$ may occur based, at least in part, on a variety of factors, such as atomic concentration of an electron back-donating material, such as NiO:CO or NiO:$NH_3$ and other materials present in the CEM device, as well as variations in processes utilized to fabricate CEM devices, and claimed subject matter is not limited in this respect.

Figure 1B:
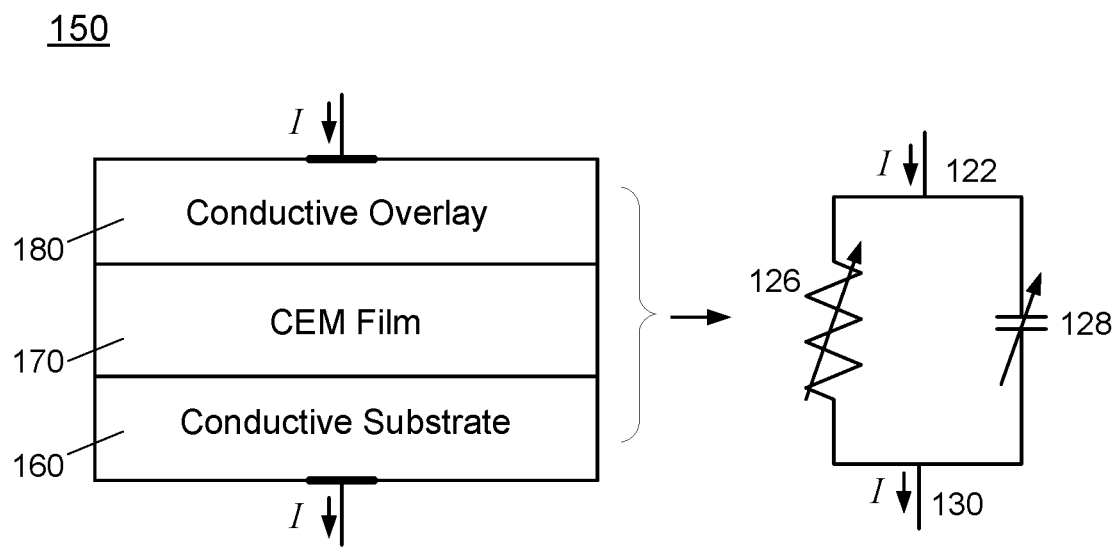
FIG. 1B is an illustration of an embodiment of a switching device comprising a correlated electron material and a schematic diagram of an equivalent circuit of a correlated electron material switch.

FIG. 1B is an illustration of an embodiment 150 of a switching device comprising a correlated electron material and a schematic diagram of an equivalent circuit of a correlated electron material switch. As previously mentioned, a correlated electron device, such as a CEM switch, a CERAM array, or other type of device utilizing one or more correlated electron materials may comprise a variable or complex impedance device that may exhibit characteristics of both variable resistance and variable capacitance. In other words, impedance characteristics for a CEM variable impedance device, such as a device comprising a conductive substrate 160, CEM film 170, and conductive overlay 180, may depend, at least in part, on resistance and capacitance characteristics of the device measured across device terminals 122 and 130. In an embodiment, an equivalent circuit for a variable impedance device may comprise a variable resistor, such as variable resistor 126, in parallel with a variable capacitor, such as variable capacitor 128. Of course, although variable resistor 126 and variable capacitor 128 are depicted in FIG. 1B as comprising discrete components, a variable impedance device, such as the device of embodiment 150, may comprise a substantially homogenous CEM film and claimed subject matter is not limited in this respect.

Table 1 below depicts an example truth table for an example variable impedance device, such as the device of embodiment 150.

TABLE 1

Correlated Electron Switch Truth Table

| Resistance | Capacitance | Impedance |
|---|---|---|
| $R_{high}(V_{applied})$ | $C_{high}(V_{applied})$ | $Z_{high}(V_{applied})$ |
| $R_{low}(V_{applied})$ | $C_{low}(V_{applied}) \sim 0$ | $Z_{low}(V_{applied})$ |

Table 1 shows that a resistance of a variable impedance device, such as the device of embodiment 150, may transition between a low-impedance state and a substantially dissimilar, high-impedance state as a function at least partially dependent on a voltage applied across a CEM device. In an embodiment, an impedance exhibited at a low-impedance state may be approximately in the range of 10.0-100,000.0 times lower than an impedance exhibited in a high-impedance state. In other embodiments, an impedance exhibited at a low-impedance state may be approximately in the range of 5.0 to 10.0 times lower than an impedance exhibited in a high-impedance state, for example. It should be noted, however, that claimed subject matter is not limited to any particular impedance ratios between relatively high-impedance states and relatively low-impedance states. Table 1 shows that a capacitance of a variable impedance device, such as the device of embodiment 150, may transition between a lower capacitance state, which, in an example embodiment, may comprise approximately zero (or very little) capacitance, and a higher capacitance state that is based, at least in part, on a voltage applied across a CEM device.

In certain embodiments, atomic layer deposition may be utilized to form or to fabricate films comprising NiO materials, such as NiO:CO or NiO:NH$_3$. In this context, a "layer," as the term is used herein, means a sheet or coating of material, which may be disposed on or over an underlying formation, such as a conductive or insulating substrate. For example, a layer deposited on an underlying substrate by way of an atomic layer deposition process may comprise a thickness of a single atom, which may comprise a thickness of a fraction of an angstrom (e.g., 0.6 Å). However, a layer encompasses a sheet or coating having a thickness greater than that of a single atom depending, for example, on a process utilized to fabricate CEM films formed from TMO materials. Additionally, a "layer" may be oriented horizontally (e.g. a "horizontal" layer), oriented vertically (e.g., a "vertical" layer), or may be positioned in any other orientation, such as diagonally, for example. In embodiments, a CEM film may comprise a sufficient number of layers, to permit electron back-donation during operation of a CEM device in a circuit environment, for example, to give rise to a low-impedance state. Also during operation in a circuit environment, for example, electron back-donation may be reversed to give rise to a substantially dissimilar impedance state, such as a high-impedance state, for example.

Also in this context, a "substrate" as used herein means a structure comprising a surface that enables materials, such as materials having particular electrical properties (e.g., conductive properties, insulative properties, etc.) to be deposited or placed on or over the substrate. For example, in a CEM-based device, a conductive substrate, such as conductive substrate 160, for example, may operate to convey an electrical current to a CEM film in contact with conductive substrate 160. In another example, a substrate may operate to insulate a CEM film to substantially reduce or to prohibit electrical current flow to or from the CEM film. In one possible example of an insulating substrate, a material such as silicon nitride (SiN) may be employed to insulate components of semiconductor structures. Further, an insulating substrate may comprise other silicon-based materials, such as silicon-on-insulator or silicon-on-sapphire technology, doped and/or undoped semiconductors, epitaxial layers of silicon supported by a base semiconductor foundation, conventional metal oxide semiconductors (e.g., a CMOS front end with a metal back end) and/or other semiconductor structures and/or technologies, including CEM switching devices. Accordingly, claimed subject matter is intended to embrace a wide variety of conductive and insulating substrates without limitation.

In particular embodiments, formation of CEM films from TMO materials on or over a substrate may utilize two or more precursors to deposit components of, for example, NiO:CO or NiO:NH$_3$, or other TMO, transition metal, or combination thereof, onto a conductive material such as a substrate. In an embodiment, layers of a TMO material film may be deposited utilizing separate precursor molecules, AX and BY, according to expression (6a), below:

$$AX_{(gas)} + BY_{(gas)} = AB_{(solid)} + XY_{(gas)} \quad (6a)$$

Wherein "A" of expression (6a) corresponds to a transition metal, transition metal compound, transition metal oxide, or any combination thereof. In embodiments, a transition metal oxide may comprise nickel, but may comprise other transition metals, transition metal compounds, and/or transition metal oxides, such as aluminum, cadmium, chromium, cobalt, copper, gold, iron, manganese, mercury, molybdenum, nickel palladium, rhenium, ruthenium, silver, tantalum, tin, titanium, vanadium, yttrium, or zinc (which may be linked to an anion, such as oxygen or other types of ligands), or combinations thereof, although claimed subject matter is not limited in scope in this respect. In particular embodiments, compounds that comprise more than one transition metal oxide may also be utilized, such as yttrium titanate (YTiO$_3$).

In embodiments, "X" of expression (6a) may comprise one or more of a ligand, such as an organic ligand, including amidinate (AMD), di(cyclopentadienyl) (Cp)$_2$, di(ethylcyclopentadienyl) (EtCp)$_2$, bis(2,2,6,6-tetramethylheptane-3,5-dionato) ((thd)$_2$), acetylacetonate (acac), bis(methylcyclopentadienyl) ((CH$_3$C$_5$H$_4$)$_2$), dimethylglyoximate (dmg), 2-amino-pent-2-en-4-onato (apo), (dmamb)$_2$ where dmamb=1-dimethylamino-2-methyl-2-butanolate, (dmamp)$_2$ where dmamp=1-dimethylamino-2-methyl-2-propanolate, di(pentamethylcyclopentadienyl) (C$_5$(CH$_3$)$_5$)$_2$ and carbonyl (CO)$_4$. Accordingly, in some embodiments, nickel-based precursor AX may comprise, for example, nickel amidinate (Ni(AMD)), bis(cyclopentadienyl)nickel (Ni(Cp)$_2$), bis(ethylcyclopentadienyl)nickel (Ni(EtCp)$_2$), bis(2,2,6,6-tetramethylheptane-3,5-dionato)Ni(II) (Ni(thd)$_2$), nickel acetylacetonate (Ni(acac)$_2$), bis(methylcyclopentadienyl)nickel (Ni(CH$_3$C$_5$H4)$_2$, nickel dimethylglyoximate (Ni(dmg)$_2$), nickel 2-amino-pent-2-en-4-onato (Ni(apo)$_2$), Ni(dmamb)$_2$ where dmamb=1-dimethylamino-2-methyl-2-butanolate, Ni(dmamp)$_2$ where dmamp=1-dimethylamino-2-methyl-2-propanolate, bis(pentamethylcyclopentadienyl)nickel (Ni(C$_5$(CH$_3$)$_5$)$_2$, and nickel tetracarbonyl (Ni(CO)$_4$), just to name a few examples.

However, in particular embodiments, a dopant operating as an electron back-donating species in addition to precursors AX and BY may be utilized to form layers of a TMO film. An electron back-donating species, which may co-flow with precursor AX, may permit formation of electron back-donating compounds, substantially in accordance with expression (6b), below. In embodiments, a dopant species or a precursor to a dopant species, such as carbon (C), ammonia (NH$_3$), methane (CH$_4$), carbon monoxide (CO), or other precursors and/or dopant species may be utilized, may provide electron back-donating ligands listed above. Thus, expression (6a) may be modified to include an additional dopant ligand substantially in accordance with expression (6b), below:

$$AX_{(gas)} + (NH_3 \text{ or other ligand comprising nitrogen}) + BY_{(gas)} = AB:NH_{3(solid)} + XY_{(gas)} \quad (6b)$$

It should be noted that concentrations, such as atomic concentrations, of precursors, such as AX, BY, and NH$_3$ (or other ligand comprising nitrogen) of expressions (6a) and (6b) may be adjusted to give rise to a final atomic concentration of nitrogen-containing or carbon-containing dopant to permit electron back-donation in a fabricated CEM device. As referred to herein, the term "atomic concentration" means the concentration of atoms in the finished material that derive from the substitutional ligand. For example, in the case in which the substitutional ligand is CO, the atomic concentration of CO in percentage terms comprises the total number of carbon atoms that comprise the material film divided by the total number of atoms in the material film, multiplied by 100.0. In another example, for the case in which the substitutional ligand is $NH_3$, the atomic concentration of $NH_3$ comprises the total number of nitrogen atoms that comprise the material film divided by the total number of atoms in the material film, multiplied by 100.0.

In particular embodiments, nitrogen or carbon containing dopants may comprise ammonia ($NH_3$), carbon (C), or carbonyl (CO) in an atomic concentration of between approximately 0.1% and 15.0%. In particular embodiments, atomic concentrations of dopants, such as $NH_3$ and CO, may comprise a more limited range of atomic concentrations such as, for example, between approximately 1.0% and 10.0%. However, claimed subject matter is not necessarily limited to the above-identified precursors and/or atomic concentrations. It should be noted that, claimed subject matter is intended to embrace all such precursors and atomic concentrations of dopants utilized in atomic layer deposition, chemical vapor deposition, plasma chemical vapor deposition, sputter deposition, physical vapor deposition, hot wire chemical vapor deposition, laser enhanced chemical vapor deposition, laser enhanced atomic layer deposition, rapid thermal chemical vapor deposition, spin on deposition, gas cluster ion beam deposition, or the like, utilized in fabrication of CEM devices from TMO materials. In expressions (6a) and (6b), "BY" may comprise an oxidizer, such as water ($H_2O$), oxygen ($O_2$), ozone ($O_3$), plasma $O_2$, hydrogen peroxide ($H_2O_2$). In other embodiments, "BY" may comprise CO, $O_2$+($CH_4$), or nitric oxide (NO)+water ($H_2O$) or an oxynitride or carbon containing a gaseous oxidizing or oxynitridizing agent. In other embodiments, plasma may be used with an oxidizer (BY) to form oxygen radicals (O*). Likewise, plasma may be used with a dopant species to form an activated species to control dopant concentration in a CEM.

In particular embodiments, such as embodiments utilizing atomic layer deposition, a substrate, such as a conductive substrate, may be exposed to precursors, such as AX and BY, as well as dopants providing electron back-donation (such as ammonia or other ligands comprising metal-nitrogen bonds, including, for example, nickel-amides, nickel-imides, nickel-amidinates, or combinations thereof) in a heated chamber, which may attain, for example, a temperature approximately in the range of 20.0° C. to 1000.0° C., for example, or between temperatures approximately in the range of 20.0° C. and 500.0° C. in certain embodiments. In one particular embodiment, in which atomic layer deposition of NiO:$NH_3$, for example, is performed, chamber temperature ranges of approximately 20.0° C. to 400.0° C. may be utilized. Responsive to exposure to precursor gases (e.g., AX, BY, $NH_3$, or other ligand comprising nitrogen), such gases may be purged from the heated chamber for durations approximately in the range of 0.5 seconds to 180.0 seconds, for example. It should be noted, however, that these are merely examples of potentially suitable ranges of chamber temperature and/or time and claimed subject matter is not limited in this respect.

In certain embodiments, a single two-precursor cycle (e.g., AX and BY, as described with reference to expression 6(a)) or a single three-precursor cycle (e.g., AX, $NH_3$, $CH_4$, or other ligand comprising nitrogen, carbon, or other electron back-donating dopant derived from an extrinsic ligand and BY, as described with reference to expression 6(b)) utilizing atomic layer deposition may bring about a layer of a TMO material film comprising a thickness approximately in the range of 0.6 Å to 5.0 Å per cycle). Accordingly, in one embodiment, if an atomic layer deposition process is capable of depositing layers of a TMO material film comprising a thickness of approximately 0.6 Å, 800-900 two-precursor cycles may be utilized to bring about a TMO material film comprising a thickness of approximately 500.0 Å. It should be noted that atomic layer deposition may be utilized to form TMO material films having other thicknesses, such as thicknesses approximately in the range of 1.5 nm to 150.0 nm, for example, and claimed subject matter is not limited in this respect.

In particular embodiments, responsive to one or more two-precursor cycles (e.g., AX and BY), or three-precursor cycles (AX, $NH_3$, $CH_4$, or other ligand comprising nitrogen, carbon or other back-donating dopant material and BY), of atomic layer deposition, a TMO material film may be exposed to elevated temperatures, which may, at least in part, enable formation of a CEM device from a TMO material film. Exposure of the TMO material film to an elevated temperature may additionally enable activation of a back-donating dopant derived from an extrinsic ligand, such as in the form of carbon, carbonyl, or ammonia, responsive to repositioning of the dopant to metal oxide lattice structures of the CEM device film.

Thus, in this context, an "elevated temperature" means a temperature at which extrinsic or substitutional ligands evaporate from a TMO material film, and/or are repositioned within a TMO material film, to such an extent that the TMO material film transitions from a resistive film to a film that is capable of switching between a relatively high-impedance or insulative state to a relatively low-impedance or conductive state. For example, in certain embodiments, a TMO material film exposed to an elevated temperature within a chamber of about 100.0° C. to about 800.0° C. for a duration of about 30.0 seconds to about 120.0 minutes may permit evaporation of extrinsic ligands from the TMO material film so as to form a CEM film. Additionally, in certain embodiments, a TMO material film exposed to an elevated temperature within a chamber of about 100.0° C. to about 800.0° C. for a duration of about 30.0 seconds to about 120.0 minutes. may permit repositioning of extrinsic ligands, for example, at oxygen vacancies within a lattice structure of a metal oxide. In particular embodiments, elevated temperatures and exposure durations may comprise more narrow ranges, such as, for example, temperatures of about 200.0° C. to about 500.0° C. for about 1.0 minute to about 60.0 minutes, for example, and claimed subject matter is not limited in these respects.

Figure 2:
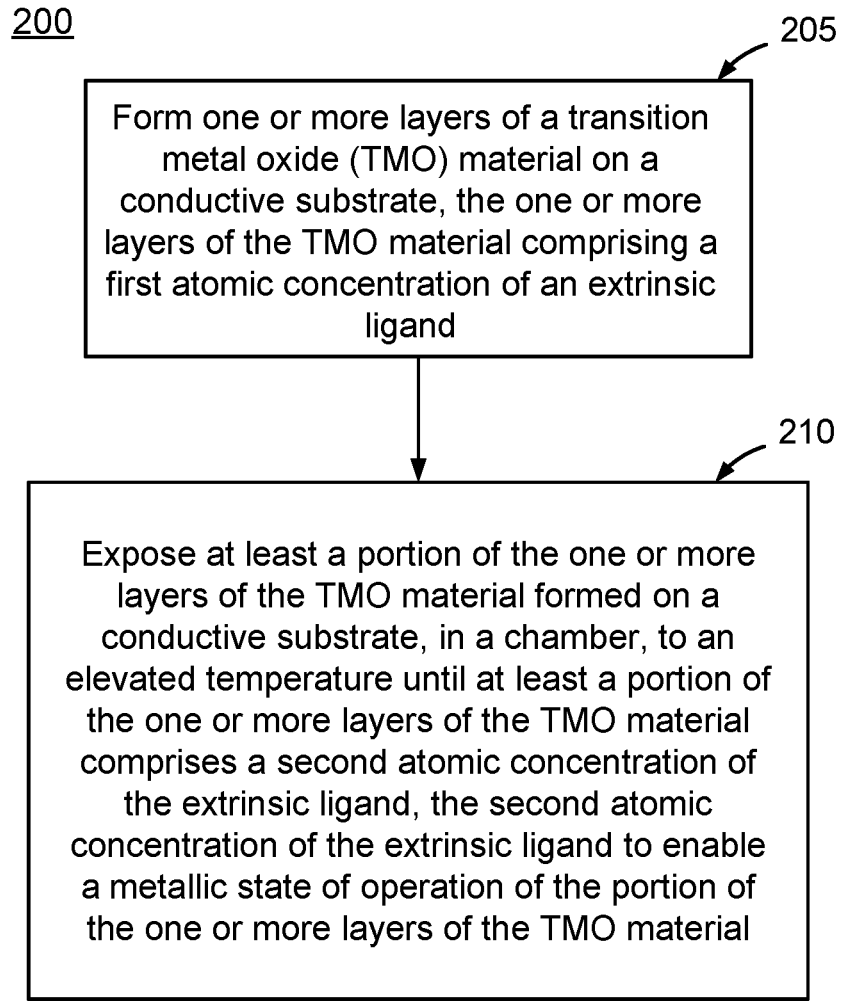
FIG. 2 is a flowchart for a method of constructing a correlated electron material (CEM) device, according to an embodiment.

FIG. 2 is a flowchart for a method of fabricating CEM devices, according to an embodiment. Example implementations, such as described in FIG. 2, and other figures described herein, may include blocks in addition to those shown and described, fewer blocks, or blocks occurring in an order different than may be identified, or any combination thereof. The method of FIG. 2 may begin at block 205, in which a deposition process, such as atomic layer deposition comprising one or more two-precursor cycles, may be utilized to form layers of a TMO material on or over a conductive substrate. In embodiments, the one or more layers of the TMO material may comprise a first atomic concentration of an extrinsic ligand. The method may continue at block 210, in which a portion of the one or more layers of the TMO material formed on the conductive substrate may be exposed, in the chamber, to an elevated temperature. An elevated temperature may comprise a temperature sufficient to evaporate an extrinsic ligand from a TMO material film and/or reposition extrinsic ligands within a TMO material film. In embodiments, exposure of the one or more layers of the TMO material may continue until the portion of the one or more layers of TMO material comprises no greater than a second atomic concentration of the extrinsic ligand. In embodiments, the second atomic concentration of the extrinsic ligand may enable a conductive state of the at least a portion of the one or more layers of the TMO material.

Thus, in accordance with embodiment 200 (of FIG. 2), a CEM film may be formed by first forming a film comprising a TMO material and an extrinsic ligand utilizing an appropriate deposition process. A film comprising a TMO material and an extrinsic ligand, such as CO, $NH_3$, or NO, for example, may comprise a relatively high atomic concentration of extrinsic ligand, such as between about 10.0% to 50.0%, for example. In certain embodiments, a TMO material combined with a relatively high atomic concentration of an extrinsic ligand may exhibit properties of a resistive element in which an applied voltage may exhibit an at least approximately linear relationship between an applied voltage and a current flow through the material. It should be noted that other atomic concentrations of extrinsic ligands combined with TMO materials also exhibit properties of a resistive element, and claimed subject matter is not limited in this respect.

In certain embodiments, responsive to exposure of a resistive film, comprising a TMO material and a relatively high atomic concentration of an extrinsic ligand, may enable evaporation of a portion of the extrinsic ligand from the resistive film. Thus, in one example, just to illustrate, a resistive film comprising a TMO material and an extrinsic ligand having an atomic concentration of about 25.0% may be exposed, in a chamber, to an elevated temperature of, for example, 500.0° C. for approximately 60.0 minutes. Responsive to such exposure, an atomic concentration of an extrinsic ligand may be significantly reduced, such as to a value of, for example, 10.0%, which may enable the resistive film to operate as a CEM device exhibiting desirable switching between impedance states.

In particular embodiments, a CEM device manufactured in accordance with a process in which a resistive film, comprising a TMO material and a relatively high atomic concentration of an extrinsic ligand, is exposed to an elevated temperature to reduce the atomic concentration of the extrinsic ligand, and/or to reposition extrinsic ligands within the TMO material film, may exhibit a "born on" property. In this context, a "born on" property means a characteristic or attribute in which the CEM device exhibits relatively low impedance (e.g., a relatively high conductivity state) immediately after fabrication of the device. Accordingly, if a CEM device is integrated into an electronics environment, for example, an initial activation utilizing a relatively small voltage applied to the CEM device may permit a relatively high current flow through the CEM device, as shown by region 104 of FIG. 1A. For example, in at least one possible embodiment, $V_{reset}$ may occur at a voltage approximately in the range of 0.1 V to 1.0 V, and $V_{set}$ may occur at a voltage approximately in the range of 1.0 V to 2.0 V, for example. Accordingly, electrical switching voltages operating in a range of approximately 2.0 V, or less, may permit a memory circuit, for example, to write to a CERAM memory device, to read from a CERAM memory device, or to change state of a CERAM switch, for example. In embodiments, such relatively low voltage operation may reduce complexity, cost, and may provide other advantages over competing memory and/or switching device technologies.

Figure 3:
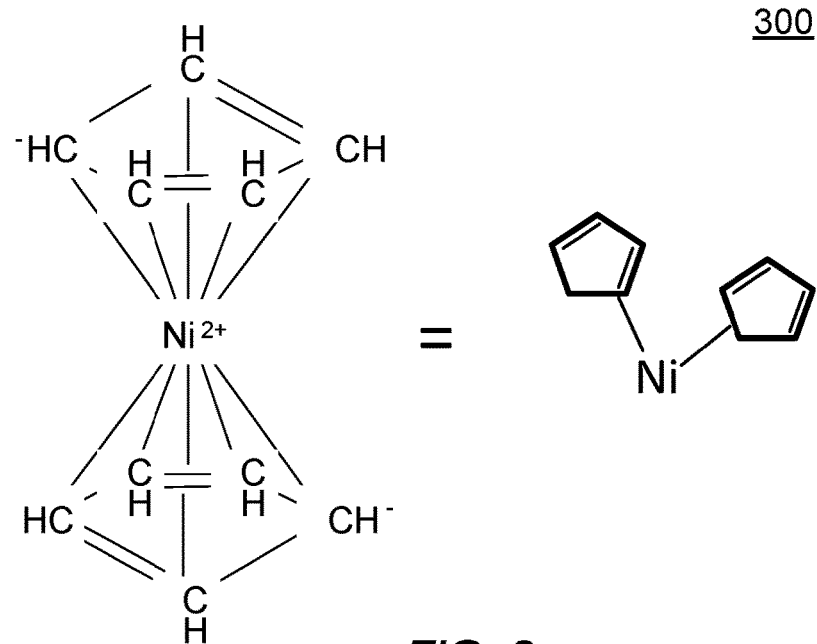
FIG. 3 is a diagram of a bis(cyclopentadienyl)nickel molecule ($Ni(C_5H_5)_2$), which may function as an example precursor, in a gaseous form, utilized in fabrication of CEM devices according to an embodiment.

FIG. 3 is a diagram of a bis(cyclopentadienyl)nickel molecule ($Ni(C_5H_5)_2$), which may function as an example precursor, in a gaseous form, utilized in fabrication of CEM devices according to an embodiment 300. As shown in FIG. 3, a nickel atom, near the center of the nickel dicyclopentadienyl molecule, has been placed in an ionization state of +2 to form an $Ni^{2+}$ ion. In the example molecule of FIG. 3, an additional electron is present in the upper left and lower right $CH^-$ sites of the cyclopentadienyl (Cp) portions of the dicyclopentadienyl ($(Cp)_2$) molecule. FIG. 3 additionally illustrates a shorthand notation showing nickel bonded to pentagon-shaped monomers of a dicyclopentadienyl ligands.

Figure 4A:
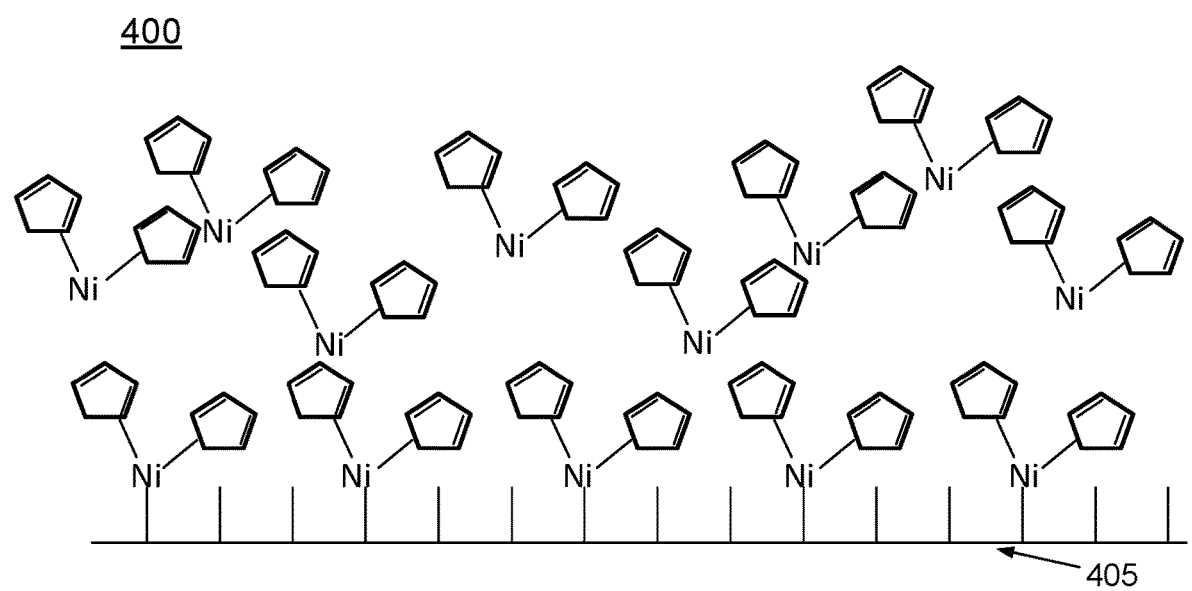
FIGS. 4A-4D show sub-processes utilized in a method for fabricating a NiO-based film comprising correlated electron material devices according to an embodiment.

FIGS. 4A-4D show sub-processes utilized in a method for fabricating a NiO-based film comprising a TMO material according to embodiments 400, 410, 420, and 430. The sub-processes of FIGS. 4A-4D may correspond to the atomic layer deposition process utilizing precursors AX and BY of expressions (6a) and (6b) to deposit components of NiO:CO onto a conductive substrate. As shown in FIG. 4A, (embodiment 400) a substrate, such as substrate 405, which may perform a function similar to that of conductive substrate 160 of FIG. 1B, may be exposed to a first gaseous precursor, such as precursor AX of expression (6a). In an embodiment, exposure to a first gaseous precursor may comprise exposure to bis(cyclopentadienyl)nickel ($Ni(Cp)_2$) for a duration of about 0.5 seconds to 180.0 seconds. As previously described, concentration, such as atomic concentration, of a first gaseous precursor, as well as exposure time, may be adjusted to enable a final atomic concentration of carbon, such as in the form of CO, of between about 0.1% and about 50.0%, for example. In certain embodiments, particularly those in which a relatively high atomic concentration of dopant (e.g., CO) is desired, exposure times and/or other subprocesses of FIGS. 3A-3D may be increased so as to enable atomic concentrations of dopant within an NiO-based film of, for example, between about 10.0% to about 50.0%, for example.

Referring to FIG. 4A exposure of a substrate to gaseous ($Ni(Cp)_2$ may result in attachment of $Ni(Cp)_2$ molecules or Ni(Cp) lattice structures at various locations of the surface of substrate 405. Deposition may take place in a heated chamber, which may attain, for example, a temperature approximately in the range of 20.0° C. to 400.0° C. However, it should be noted that additional temperature ranges, such as temperature ranges comprising less than approximately 20.0° C. and greater than approximately 400.0° C. are possible, and claimed subject matter is not limited in this respect.

Figure 4B:
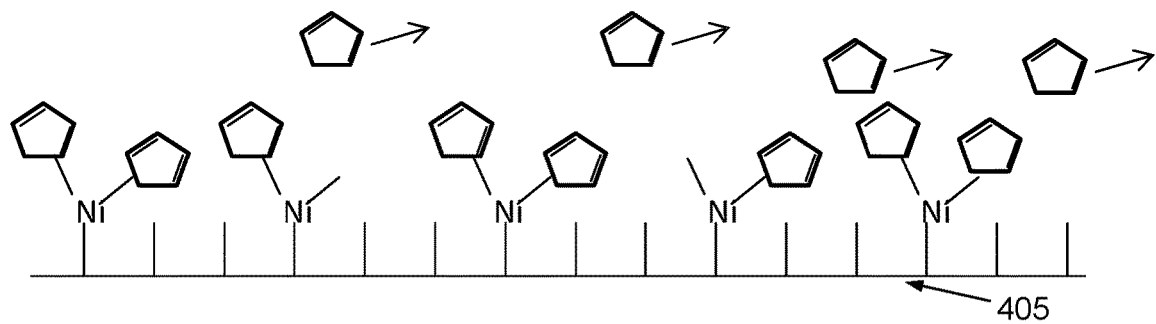

As shown in FIG. 4B, (embodiment 410) after exposure of a conductive substrate, such as conductive substrate 405, to a gaseous precursor, such as a gaseous precursor comprising $Ni(Cp)_2$, the chamber may be purged of remaining gaseous $Ni(Cp)_2$ and/or Cp ligands. In an embodiment, for the example of a gaseous precursor comprising $Ni(Cp)_2$, the chamber may be purged for a duration approximately in the range of 0.5 seconds to 180.0 seconds. In one or more embodiments, a purge duration may depend, for example, on affinity or attraction (aside from chemical bonding) of unreacted ligands to surfaces within the chamber.

Figure 4C:
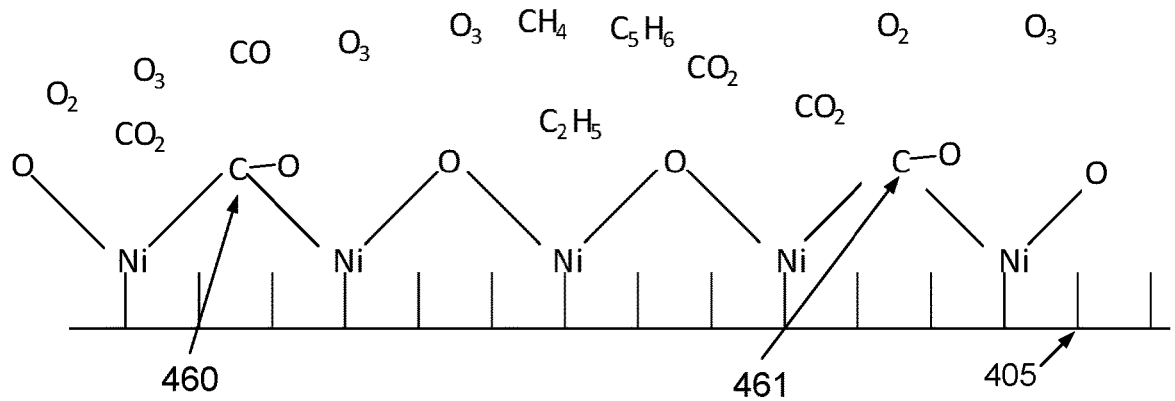

As shown in FIG. 4C, (embodiment 420) a second gaseous precursor, such as precursor BY of expression (6a), may be introduced into the chamber. As previously mentioned, a second gaseous precursor may comprise an oxidizer, which may operate to displace a first ligand, such as $(Cp)_2$, for example, and replace the ligand with an oxidizer, such as oxygen ($O_2$), ozone ($O_3$), nitric oxide (NO), hydrogen peroxide ($H_2O_2$), just to name a few examples. Accordingly, as shown in FIG. 4C, oxygen atoms may form bonds with at least some nickel atoms bonded to substrate 405. In an embodiment, precursor BY may oxidize Ni(Cp)₂ to form a number of additional oxidizers, and/or combinations thereof, in accordance with expression (7) below:

$$Ni(C_5H_5)_2 + O_3 \rightarrow NiO +$$

potential byproducts (e.g., $CO, CO_2, C_5H_5, C_5H_6, CH_3, CH_4, C_2H_5, C_2H_6, \ldots$)   (7)

wherein $C_5H_5$ has been substituted for Cp in expression (7). As shown in FIG. 4C, a number of potential byproducts are shown, including $C_2H_5$, $CO_2$, $CH_4$, and $C_5H_6$, for example. As also shown in FIG. 3C, carbonyl (CO) molecules may bond to nickel oxide lattice structures, such as at sites 460 and 461, for example. In embodiments, as previously mentioned herein, relatively high atomic concentrations of nickel-to-carbonyl bonds (e.g., NiO:CO), such as atomic concentrations between, for example, about 10.0% and about 50.0%, may give rise to films that at least approximate resistive properties.

In particular embodiments, the introduction of an oxidizing agent may be limited so as to enable formation of NiO lattice structures having a relatively high percentage of oxygen vacancies. Thus, in one embodiment, an amount of oxygen introduced in the subprocess of FIG. 4C may be less than a stoichiometric quantity, which may encourage formation of NiO lattice structures comprising a percentage of oxygen vacancies above a threshold amount. For example, in particular embodiments, the subprocess of FIG. 4C may utilize between about 25.0% of a stoichometric amount of oxygen and about 95.0% of a stoichiometric amount of oxygen, and claimed subject matter is not limited in this respect. In certain embodiments, in addition to use of non-stoichiometric amounts of oxygen, a desired or threshold percentage of oxygen vacancies may be brought about by co-flowing a precursor gas that may affect bonding of oxygen with NiO lattice structures, for example. In addition, other parameters of deposition processes, such as chamber temperatures, precursor gas temperatures, and so forth may be modified so as to bring about NiO lattice structures having at least a threshold percentage of oxygen vacancies. It should be noted that claimed subject matter is not limited to modifying particular parameters used in atomic layer deposition processes. Rather, claimed subject matter is intended to embrace all deposition processes that enable at least a threshold percentage of oxygen vacancies in NiO lattice structures.

Figure 4D:
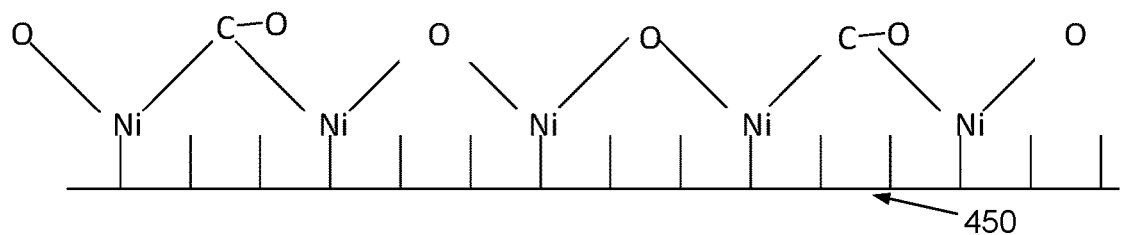

As shown in FIG. 4D, (embodiment 430) responsive to introduction of one or more oxidizing agents such as described with reference to FIG. 4C, potential hydrocarbon byproducts, such as CO, $CO_2$, $C_5H_5$, $C_5H_6$, $CH_3$, $CH_4$, $C_2H_5$, $C_2H_6$, for example, may be purged from the chamber. In particular embodiments, purging of the chamber may occur for a duration approximately in the range of 0.5 seconds to 180.0 seconds utilizing a pressure approximately in the range of 0.01 Pa to 105.0 kPa, although claimed subject matter is not limited in this respect.

In particular embodiments, the sub-processes of FIGS. 4A-4D may be repeated until a desired thickness of a TMO material film is achieved, such as a thickness of about 1.5 nm to about 100.0 nm, for example. As previously mentioned herein, atomic layer deposition approaches, such as shown and described with reference to FIGS. 4A-4D, for example, may, at least in part, give rise to a TMO material film having a thickness of about 0.6 Å to about 1.5 Å for one atomic layer deposition cycle, for example. Accordingly, to construct a TMO material film comprising a thickness of 500.0 Å (50.0 nm), just as a possible example, approximately 300 to 900 two-precursor cycles, utilizing AX+BY for example, may be performed. In certain embodiments, parameters of layer deposition cycles may be adjusted to obtain desired properties, such as atomic concentrations of substitutional ligands operating as dopants, for example, and claimed subject matter is not limited in this respect.

In particular embodiments, after the completion of one or more atomic layer deposition cycles, a TMO material film may be exposed to an elevated temperature, which may assist in converting at least a portion of the TMO material film to a CEM. Such conversion may permit, at least in certain embodiments, a film comprising a TMO material and a dopant to transition from a resistive device, in which a current flow through the device may be approximately linearly proportional to an applied voltage, to a device that exhibits impedance state transitions, such as from a high-impedance or insulative state to a low-impedance or conductive state. In embodiments, exposure of a TMO material film to an elevated temperature may involve use of a temperature-controlled chamber to bring about temperatures of about 100.0° C. to about 800.0° C. for durations within a range of about 30.0 seconds to about 120.0 minutes. In particular embodiments, chamber temperatures may be confined to slightly more narrow ranges, such as, for example, temperatures of about 200.0° C. to about 500.0° C. for durations within a range of about 1.0 minutes to about 60.0 minutes, for example, and claimed subject matter is not limited in these respects.

Figure 5A:
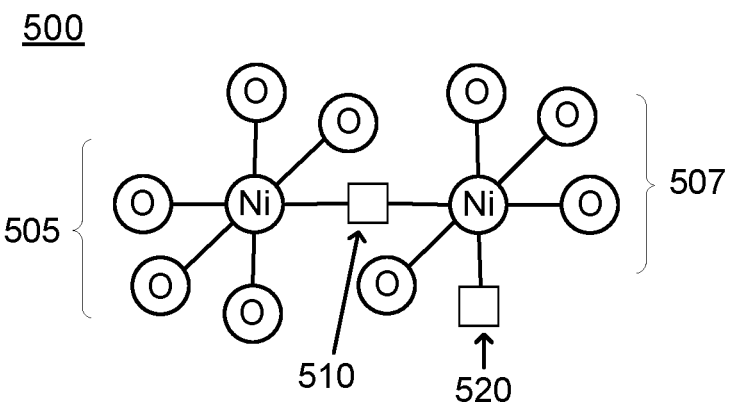
FIGS. 5A and 5B show a representative portion of a nickel oxide lattice structure comprising defects in the form of oxygen vacancies, which may be repaired by carbonyl molecules (CO) or by ammonia molecules ($NH_3$), according to embodiment.
Figure 5B:
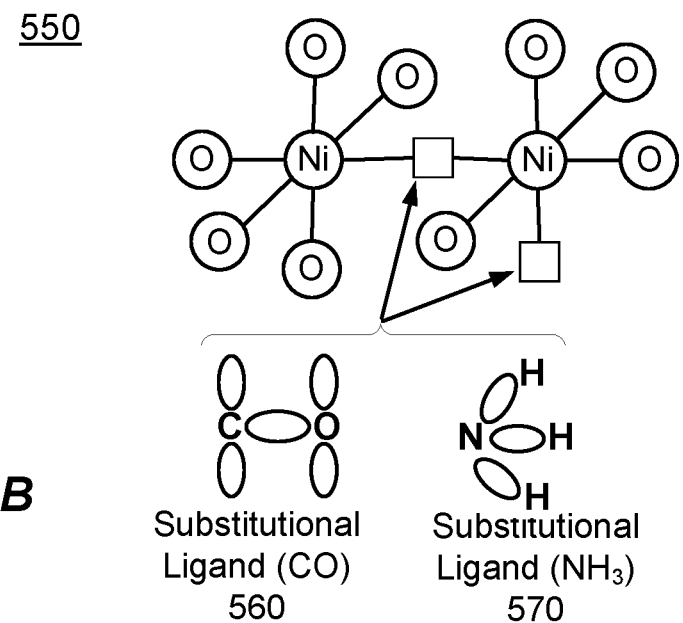

FIGS. 5A and 5B show a representative portion of a nickel oxide lattice structure comprising defects in the form of oxygen vacancies, which may be repaired by carbonyl molecules (CO) or by ammonia molecules ($NH_3$), according to embodiments 500 and 550. In a particular embodiment, NiO complexes 505 and 507 may represent coordination spheres of Ni atoms, which may be surrounded by as many as six oxygen atoms (referenced by "O" in FIGS. 5A and 5B). However, as shown in FIG. 5A, oxygen vacancies 510 and 520 may indicate locations at which an oxygen atom has been dislocated or displaced, for example, responsive to use of nonstoichiometric amounts of precursor gases, such described in reference to FIG. 4C. It should be noted that oxygen vacancies within NiO lattice structures may be brought about via use of other deposition techniques, other than atomic layer deposition, such as chemical vapor deposition, plasma chemical vapor deposition, sputter deposition, physical vapor deposition, hot wire chemical vapor deposition, laser enhanced chemical vapor deposition, laser enhanced atomic layer deposition, rapid thermal chemical vapor deposition, spin on deposition, or the like, As shown in FIG. 5B, oxygen vacancies within a transition metal oxide lattice structure, such a lattice structure comprising NiO, for example, may be repaired by extrinsic CO ligand 560 or extrinsic $NH_3$ ligand 570, which may operate as substitutional ligands to fill oxygen vacancies, such as oxygen vacancies 510 and 520 of FIG. 5A. CO ligand 560 or $NH_3$ ligand 570 may be positioned at oxygen vacancies of a TMO material film during a heating or annealing process in which a film is exposed, in a chamber, to an elevated temperature of about 200.0° C. to about 500.0° C. for a duration of about 1.0 minutes to about 60.0 minutes, for example, and claimed subject matter is not limited in these respects. When extrinsic ligands CO or $NH_3$ are present within a TMO material lattice structure, such as a NiO lattice structure, the extrinsic ligands may operate to permit the metal to back-donate one or more electrons to a lattice structure of a TMO material. As previously mentioned herein, back-donation permits a TMO material to operate as a CEM in which electrons are controllably, and reversibly donated to a conduction band of a TMO material, for example. Such reversible donation permits a TMO material, such as NiO:CO, to switch between a high-impedance or insulative state and a low-impedance or conductive state.

In addition to repairing defects, such as oxygen vacancies, for example, in a lattice structure of a TMO material, exposing a TMO material film to an elevated temperature may reduce an atomic concentration of a dopant within a deposited film. For example, in an embodiment, a TMO film comprising an atomic concentration of a dopant such as CO, for example, may be reduced from a first atomic concentration, such as a concentration of between about 10.0% to about 50.0%, to a second atomic concentration, such as a concentration of between about 1.0% to about 15.0%. In embodiments, such reductions may permit a deposited film, such as a film comprising a transition metal and/or a TMO, to be transformed from a resistive circuit element to a circuit element exhibiting correlated electron material device properties. Exposure of a TMO material film to an elevated temperature may give rise to additional benefits, such as more evenly distributing dopant molecules, such as CO, for example, and claimed subject matter is not limited in this respect.

Figure 6A:
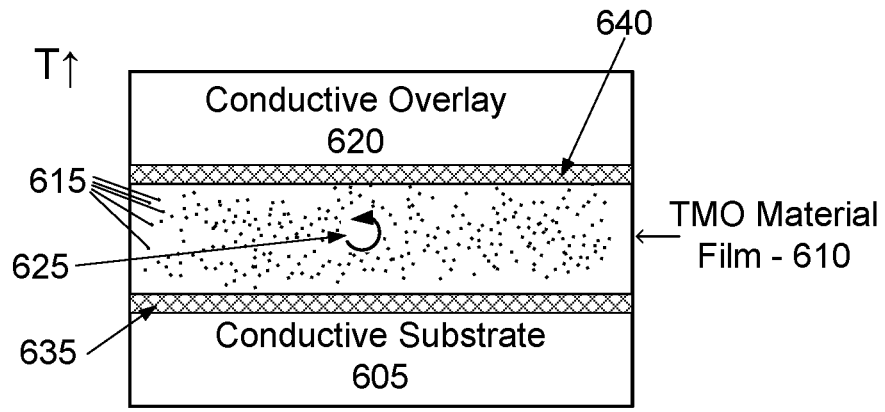
FIG. 6A is an illustration of dopant molecules within a transition metal oxide (TMO) material film repositioning to oxygen vacancies, as well as formation of an oxide layer, according to an embodiment.

FIG. 6A is an illustration of dopant molecules within a TMO material film repositioning to oxygen vacancies, as well as formation of an oxide layer, according to an embodiment 600. Repositioning of dopant molecules, such as CO or $NH_3$, just to name possible examples, may occur in response to elevating the temperature of TMO material film 610, such as a temperature of temperature of about 200.0° C. to about 500.0° C., as shown by the descriptor TT in FIG. 6A. In particular embodiments, conductive overlay 620 and conductive substrate 605, both of which may be in contact with at least a portion of TMO material film 610, may operate to restrict evaporation of dopant molecules. In embodiments, a restriction of evaporation of a dopant may permit repairing of oxygen vacancies, such as oxygen vacancies 510 and 520 of FIG. 5A, without significantly reducing atomic concentration of a dopant. Restriction of evaporation of dopant within a TMO material may, at least partially enable additional outcomes, and claimed subject matter is not limited in this respect.

In particular embodiments, elevating a temperature of a TMO material film 610 may operate to impart sufficient thermal energy to extrinsic ligand molecules 615, which may represent molecules of, for example, CO, NO, or $NH_3$, so as to relocate freestanding or unattached extrinsic ligand molecules to oxygen vacancies, such as oxygen vacancies 510 and 520 described in reference to FIGS. 5A and 5B. In certain embodiments, such repositioning of extrinsic ligand molecules to oxygen vacancies, which may be represented by arrow 625 in FIG. 6A, may permit activation of donation/back donation in which electrons are controllably, and reversibly donated to the conduction band of a TMO material, for example. Such reversible electron donation permits a TMO material, such as NiO:CO, to switch between a high-impedance or insulative state and a low-impedance or conductive state, which may be characteristic of CEM operation.

In addition to evaporation and/or repositioning of dopant molecules, exposure of a TMO material film may assist in the formation of oxide layer 635 at an interface between conductive substrate 605 and a TMO material film 610 and at an interface between conductive overlay 620 and TMO material film 610. In the embodiment of FIG. 6A, conductive substrate 605 and conductive overlay 620 may comprise a material capable of forming a conductive oxide, such as ruthenium, or iridium, for example. A presence of excess oxidizer, such as $O_2$, ozone $O_3$, NO, and so forth, which may accumulate within TMO material film 610 during a deposition process such as atomic layer deposition as described with reference to FIGS. 4A-4C, may enable the formation of oxide layers 635 and 640. In embodiments, conductive substrate 605 and conductive overlay 620 may comprise an atomic concentration of at least about 50.0% ruthenium or of at least about 50.0% iridium, which may enable the formation of ruthenium oxide or iridium oxide at layers 635 and 640. However, claimed subject matter is intended to embrace conductive substrates and conductive overlays comprising all types of conductive materials that may form conductive oxides at an interface with a TMO material film.

Figure 6B:
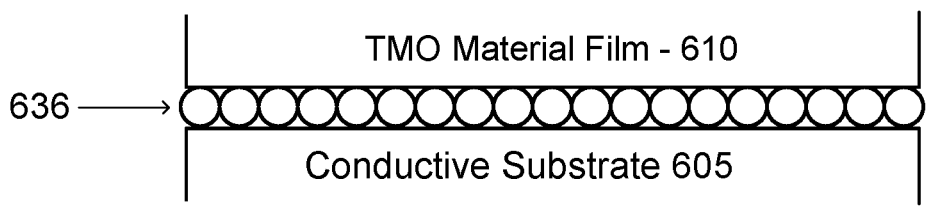
FIGS. 6B-6C is an illustration showing formation of a monolayer and a submonolayer layer of conductive oxides at an interface between a CEM film and a conductive substrate responsive to exposure of the CEM film and substrate to a temperature, according to an embodiment.

In particular embodiments, oxide layer 635 and/or 640 may comprise a thickness of up to about 50.0 nm; however, claimed subject matter is intended to embrace oxide layers having thicknesses greater than about 50.0 nm, such as about 60.0 nm, about 75.0 nm, and so forth. In other embodiments, such as the embodiment of FIG. 6B (embodiment 650), oxide layer 636 may comprise a thickness significantly less than 50.0 nm, such as a "monolayer." In this context, a monolayer means a layer of a conductive oxide having a thickness corresponding to that of a single molecule. Accordingly, as shown in FIG. 6B, oxide layer 636 comprises a thickness of a single molecule, wherein an individual molecule is represented by an "O," covers approximately 100.0% of TMO material film 610. Thus, in embodiment 650, oxide layer 636, having a thickness of a monolayer, may separate conductive substrate 605 from TMO material film 610. It should be noted that although not explicitly identified in FIG. 6B, in particular embodiments, oxide layer 640, which separates conductive overlay 620 from TMO material film 610 may also comprise a monolayer.

Figure 6C:
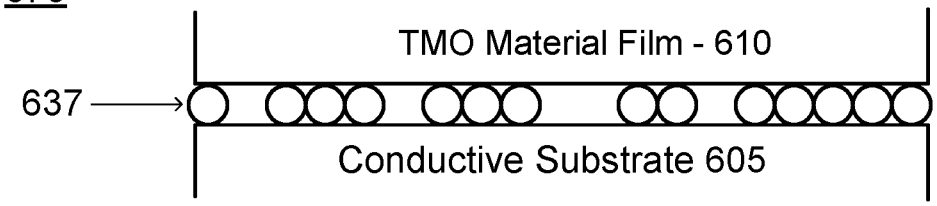

However, in other embodiments, such as the embodiment of FIG. 6C (embodiment 675), oxide layer 637 may comprise a "submonolayer," which, in this context, means a layer of conductive oxide having a thickness of less than that of a single molecule. Accordingly, as shown in FIG. 6C, oxide layer 637 comprises a layer covering less than 100.0% of TMO material film 610. In embodiments, such a layer would permit at least occasional direct contact between TMO material film 610 and conductive substrate 605. It should be noted that although not explicitly identified in FIG. 6C, in particular embodiments, oxide layer 640, which separates conductive overlay 620 from TMO material film 610 may also comprise a submonolayer.

FIG. 7 is a diagram showing a heat source to bring about an elevated temperature of a TMO material film according to an embodiment 700. As described with reference to FIG. 2, for example, a resistive film comprising a TMO material and an extrinsic ligand having an atomic concentration of about 25.0% may be exposed in a chamber to an elevated temperature of, for example, 500.0° for approximately 60.0 minutes. Responsive to such exposure, an atomic concentration of an extrinsic ligand may be significantly reduced, such as to a value of, for example, 10.0%, which may enable the resistive film to operate as a CEM device exhibiting desirable switching of impedance states. However, in particular embodiments, it may be advantageous to expose a film comprising a TMO material in a chamber, for example, to a relatively high temperature for a reduced duration such as, for example, about 250.0 µs to about 2.0 seconds, utilizing a xenon flashlamp or laser heat source. In the embodiment of FIG. 7, flashlamp 705 may be pulsed or flashed over a relatively short duration, such as 250.0 µs, for example, so as to elevate a temperature of portion 611, without significantly elevating the temperature of portion 612 of TMO material film 610. Such exposure to flashlamp 705 may provide elevated temperatures of between about 900° C. to about 1500° C. at a portion of one or more layers of TMO material film 610. In particular embodiments, flashlamp 705 may be complemented, or replaced by, laser source 715, which may permit temperature elevation of selected sub portions, such as sub portion 613, of TMO material film 610. In embodiments, laser source 715 may emit pulses, such as pulses between 0.5 µs and 2.0 µs, so as to bring about a temperature of at least a portion of one or more layers of a TMO material of between 900.0° C. and 1500.0° C. It should be noted, however, that claimed subject matter is intended to embrace operation of pulsed and/or continuous wave laser sources to bring about a range of temperatures of the TMO material film, such as temperatures below 900.0° C., for example, and above 1500.0° C.

Figure 9:
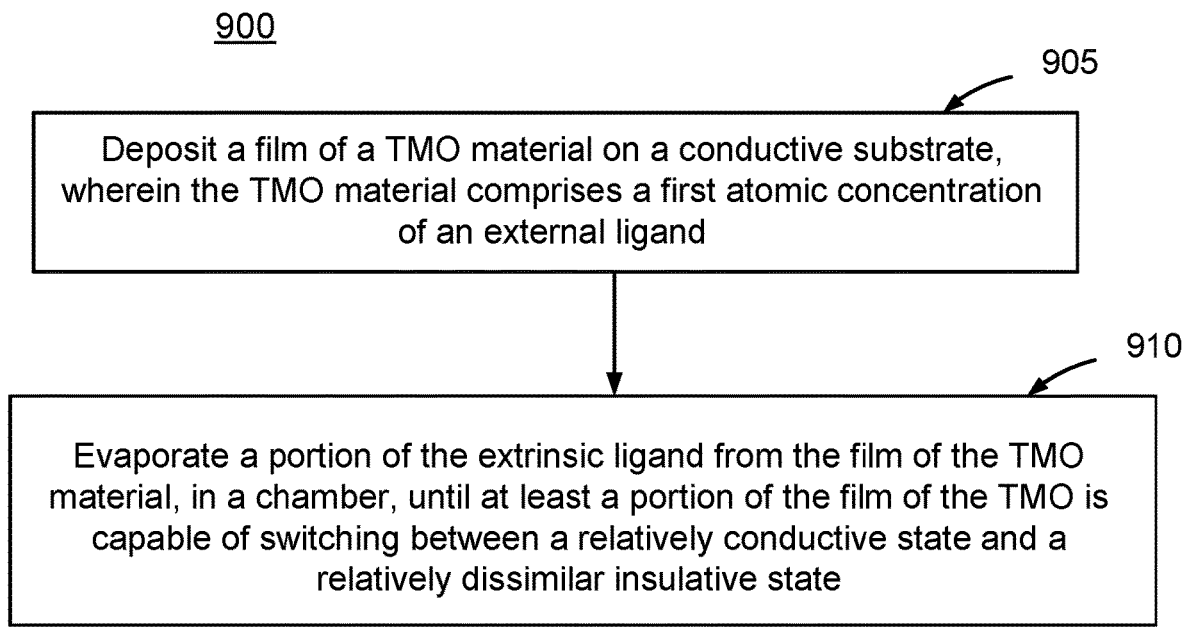

FIGS. 8-9 are flowcharts for additional methods of constructing a CEM device, according to embodiments. The method of FIG. 8 (embodiment 800) may begin at block 805, in which a film of a TMO material may be deposited on a conductive substrate, such as conductive substrate 605 of FIG. 6A, for example. In embodiments, the TMO material film may comprise a first atomic concentration of an extrinsic ligand. The method may continue at block 810, which may comprise exposing at least a portion of the film of the TMO material to an elevated temperature to reduce the atomic concentration of the extrinsic ligand. In embodiments, exposure to an elevated temperature may continue at least until a portion of the film of the TMO material is cable of switching between a relatively conductive state and a relatively dissimilar insulative state.

The method of FIG. 9 (embodiment 900) may begin at block 905, which may comprise depositing a film of the TMO material on a conductive substrate, wherein the TMO material comprises a first atomic concentration of an external ligand. Block 910 may comprise evaporating a portion of the extrinsic ligand from the film of the TMO material, in a chamber, until at least a portion of the film of the TMO material is capable of switching between a relatively conductive state and a relatively dissimilar insulative state.

In embodiments, CEM devices may be implemented in any of a wide range of integrated circuit types. For example, numerous CEM devices may be implemented in an integrated circuit to form a programmable memory array, for example, that may be reconfigured by changing impedance states for one or more CEM devices, in an embodiment. In another embodiment, programmable CEM devices may be utilized as a non-volatile memory array, for example. Of course, claimed subject matter is not limited in scope to the specific examples provided herein.

A plurality of CEM devices may be formed to enable integrated circuit devices, which may include, for example, a first correlated electron device having a first correlated electron material and a second correlated electron device having a second correlated electron material, wherein the first and second correlated electron materials may comprise substantially dissimilar impedance characteristics that differ from one another. In addition, in an embodiment, a first CEM device and a second CEM device, comprising impedance characteristics that differ from one another, may be formed within a particular level of an integrated circuit. Further, in an embodiment, forming the first and second CEM devices within a particular level of an integrated circuit may include forming the CEM devices at least in part by selective epitaxial deposition. In another embodiment, the first and second CEM devices within a particular level of the integrated circuit may be formed at least in part by ion implantation, such as to alter impedance characteristics for the first and/or second CEM devices, for example.

In the preceding description, in a particular context of usage, such as a situation in which tangible components (and/or similarly, tangible materials) are being discussed, a distinction exists between being "on" and being "over." As an example, deposition of a substance "on" a substrate refers to a deposition involving direct physical and tangible contact without an intermediary, such as an intermediary substance (e.g., an intermediary substance formed during an intervening process operation), between the substance deposited and the substrate in this latter example; nonetheless, deposition "over" a substrate, while understood to potentially include deposition "on" a substrate (since being "on" may also accurately be described as being "over"), is understood to include a situation in which one or more intermediaries, such as one or more intermediary substances, are present between the substance deposited and the substrate so that the substance deposited is not necessarily in direct physical and tangible contact with the substrate.

A similar distinction is made in an appropriate particular context of usage, such as in which tangible materials and/or tangible components are discussed, between being "beneath" and being "under." While "beneath," in such a particular context of usage, is intended to necessarily imply physical and tangible contact (similar to "on," as just described), "under" potentially includes a situation in which there is direct physical and tangible contact, but does not necessarily imply direct physical and tangible contact, such as if one or more intermediaries, such as one or more intermediary substances, are present. Thus, "on" is understood to mean "immediately over" and "beneath" is understood to mean "immediately under."

It is likewise appreciated that terms such as "over" and "under" are understood in a similar manner as the terms "up," "down," "top," "bottom," and so on, previously mentioned. These terms may be used to facilitate discussion, but are not intended to necessarily restrict scope of claimed subject matter. For example, the term "over," as an example, is not meant to suggest that claim scope is limited to only situations in which an embodiment is right side up, such as in comparison with the embodiment being upside down, for example. An example includes a flip chip, as one illustration, in which, for example, orientation at various times (e.g., during fabrication) may not necessarily correspond to orientation of a final product. Thus, if an object, as an example, is within applicable claim scope in a particular orientation, such as upside down, as one example, likewise, it is intended that the latter also be interpreted to be included within applicable claim scope in another orientation, such as right side up, again, as an example, and vice-versa, even if applicable literal claim language has the potential to be interpreted otherwise. Of course, again, as always has been the case in the specification of a patent application, particular context of description and/or usage provides helpful guidance regarding reasonable inferences to be drawn.

Unless otherwise indicated, in the context of the present disclosure, the term "or" if used to associate a list, such as A, B, or C, is intended to mean A, B, and C, here used in the inclusive sense, as well as A, B, or C, here used in the exclusive sense. With this understanding, "and" is used in the inclusive sense and intended to mean A, B, and C;

whereas "and/or" can be used in an abundance of caution to make clear that all of the foregoing meanings are intended, although such usage is not required. In addition, the term "one or more" and/or similar terms is used to describe any feature, structure, characteristic, and/or the like in the singular, "and/or" is also used to describe a plurality and/or some other combination of features, structures, characteristics, and/or the like. Furthermore, the terms "first," "second," "third," and the like are used to distinguish different aspects, such as different components, as one example, rather than supplying a numerical limit or suggesting a particular order, unless expressly indicated otherwise. Likewise, the term "based on" and/or similar terms are understood as not necessarily intending to convey an exhaustive list of factors, but to allow for existence of additional factors not necessarily expressly described.

Furthermore, it is intended, for a situation that relates to implementation of claimed subject matter and is subject to testing, measurement, and/or specification regarding degree, to be understood in the following manner. As an example, in a given situation, assume a value of a physical property is to be measured. If alternatively reasonable approaches to testing, measurement, and/or specification regarding degree, at least with respect to the property, continuing with the example, is reasonably likely to occur to one of ordinary skill, at least for implementation purposes, claimed subject matter is intended to cover those alternatively reasonable approaches unless otherwise expressly indicated. As an example, if a plot of measurements over a region is produced and implementation of claimed subject matter refers to employing a measurement of slope over the region, but a variety of reasonable and alternative techniques to estimate the slope over that region exist, claimed subject matter is intended to cover those reasonable alternative techniques, even if those reasonable alternative techniques do not provide identical values, identical measurements or identical results, unless otherwise expressly indicated.

It is further noted that the terms "type" and/or "like," if used, such as with a feature, structure, characteristic, and/or the like, using "optical" or "electrical" as simple examples, means at least partially of and/or relating to the feature, structure, characteristic, and/or the like in such a way that presence of minor variations, even variations that might otherwise not be considered fully consistent with the feature, structure, characteristic, and/or the like, do not in general prevent the feature, structure, characteristic, and/or the like from being of a "type" and/or being "like," (such as being an "optical-type" or being "optical-like," for example) if the minor variations are sufficiently minor so that the feature, structure, characteristic, and/or the like would still be considered to be predominantly present with such variations also present. Thus, continuing with this example, the terms optical-type and/or optical-like properties are necessarily intended to include optical properties. Likewise, the terms electrical-type and/or electrical-like properties, as another example, are necessarily intended to include electrical properties. It should be noted that the specification of the present disclosure merely provides one or more illustrative examples and claimed subject matter is intended to not be limited to one or more illustrative examples; however, again, as has always been the case with respect to the specification of a patent application, particular context of description and/or usage provides helpful guidance regarding reasonable inferences to be drawn.

In the preceding description, various aspects of claimed subject matter have been described. For purposes of explanation, specifics, such as amounts, systems, and/or configurations, as examples, were set forth. In other instances, well-known features were omitted and/or simplified so as not to obscure claimed subject matter. While certain features have been illustrated and/or described herein, many modifications, substitutions, changes, and/or equivalents will occur to those skilled in the art. It is, therefore, to be understood that the appended claims are intended to cover all modifications and/or changes as fall within claimed subject matter.

What is claimed is:

1. A method of constructing a correlated electron material (OEM) device, comprising:
    forming one or more layers of a transition metal oxide (TMO) material over a substrate, the one or more layers of the TMO material comprising a first atomic concentration of an extrinsic ligand; and
    exposing at least a first portion of the one or more layers of the TMO material formed over the substrate, in a chamber, to an elevated temperature without exposing at least a second portion of the one or more layers of the TMO material to the elevated temperature until at least the first portion of the one or more layers of the TMO material comprises no greater than a second atomic concentration of the extrinsic ligand to render the first portion of the one or more layers of the TMO material capable of switching between a relatively conductive state and a substantially dissimilar insulative state without rendering the second portion of the one or more layers of the TMO material capable of switching between the relatively conductive state and the substantially dissimilar insulative state.

2. The method of claim 1, wherein the second atomic concentration of the extrinsic ligand is less than the first atomic concentration of the extrinsic ligand.

3. The method of claim 1, wherein the extrinsic ligand provides a dopant to enable the low-impedance or conductive slate of the at least the first portion of the one or more layers of the TMO material.

4. The method of claim 3, wherein the dopant comprises carbon, carbonyl (CO), nitric oxide (NO), or ammonia (NH3).

5. The method of claim 1, further comprising forming a conductive overlay over the one or more layers of TMO material prior to exposing the at least the first portion of the one or more layers of the TMO material formed over the substrate to the elevated temperature.

6. The method of claim 5, wherein the exposing the at least the first portion of the one or more layers of the TMO material to the elevated temperature comprises exposing the at least the first portion of the one or more layers of the TMO material to the elevated temperature at least until a conductive oxide layer is formed at an interface between the substrate and the TMO material.

7. The method of claim 6, wherein the conductive oxide layer comprises a sub-monolayer of the conductive oxide, a monolayer of the conductive oxide, or a plurality of layers of the conductive oxide.

8. The method of claim 6, wherein the substrate comprises at least 50.0% atomic concentration of iridium, and wherein the conductive oxide layer comprises iridium oxide.

9. The method of claim 6, wherein the substrate comprises at least 50.0% atomic concentration of ruthenium, and wherein the conductive oxide layer comprises ruthenium oxide.

10. The method of claim 1, wherein the second atomic concentration comprises an atomic concentration of the extrinsic ligand in the at least the first portion of the one or more layers of the TMO material of about 0.1% to about 15.0%.

11. The method of claim 1, wherein the elevated temperature comprises a range of between about 900° C. to about 1500° C., and wherein the at least the first portion of the one or more layers of the TMO material is exposed to the elevated temperature for a duration of about 0.5 µs to about 2.0 µs or for a duration of about 250 µs to about 2.0 seconds.

12. The method of claim 1, wherein the elevated temperature is achieved, at least in part, via one or more laser pulses having a duration of between 0.5 µs and 2.0 µs to provide a temperature equal to about 900.0° C. to about 1500.0° C. at the at least the first portion of the one or more layers of the TMO material.

13. The method of claim 1, wherein the elevated temperature is achieved, at least in part, utilizing one or more pulses of a flashlamp for duration of between about 250.0 µs and about 2.0 seconds to provide a temperature equal to about 900.0° C. to about 1500.0° C. at the at least the first portion of the one or more layers of the TMO material.

14. The method of claim 1, wherein the first atomic concentration of the extrinsic ligand in the one or more layers of TMO material comprises an atomic concentration of between about 0.1% and about 50.0%.

15. A method of fabricating a correlated electron material (CEM) device, comprising:
    forming a film of a transition metal oxide (TMO) material over a substrate, the TMO material comprising an atomic concentration of an extrinsic ligand; and
    exposing at least a first portion of the film of the TMO material, in a chamber, to an elevated temperature without exposing at least a second portion of the film of TMO material to the elevated temperature to reduce the atomic concentration of the extrinsic ligand in the at least the first portion of the film of TMO material until the at least the first portion of the film of the TMO material is capable of switching between a conductive state and a substantially dissimilar insulative state while maintaining the second portion of the film of TMO material incapable of switching between the conductive state and the substantially dissimilar state insulative state.

16. The method of claim 15, wherein the at least the first portion of the film of the TMO material, operating in the substantially dissimilar insulative state, exhibits a resistance at least 5.0 times a resistance exhibited in the conductive slate.

17. The method of claim 15, wherein the extrinsic ligand corresponds to carbon, carbonyl (CO), nitric oxide (NO), or ammonia (NH3).

18. The method of claim 15, further comprising forming a conductive overlay over the film of TMO material prior to exposing the at least the first portion of the film of TMO material to the elevated temperature.

19. The method of claim 15, wherein the substrate comprises at least 50.0% atomic concentration of iridium or at least 50.0% atomic concentration of ruthenium, and wherein the exposing acts to form at least a submonolayer of iridium oxide or ruthenium oxide at an interface between the film of the TMO material and the substrate.

20. The method of claim 15, wherein the film of the TMO material comprises a conductive attribute.

21. The method of claim 15, wherein the elevated temperature comprises a range of between about 900° C. to about 1500° C., and wherein the at least the first portion of the film of the TMO material is exposed to the elevated temperature for a duration of about 0.5 µs to about 2.0 µs or for a duration of about 250 µs to about 2.0 seconds.

22. The method of claim 15, wherein the elevated temperature is achieved, at least in part, via one or more laser pulses having a duration of between 0.5 µs and 2.0 µs to provide a temperature of between about 900.0° C. to about 1500.0° C. at the at least the first portion of the film of the TMO material.

23. The method of claim 15, wherein the elevated temperature is achieved, at least in part, via one or more pulses of a flashlamp having a duration of between about 250.0 µs and about 2.0 seconds to provide a temperature of between about 900.0° C. to about 1500.0° C. at the at least the first portion of the film of the TMO material.

24. The method of claim 15, wherein the atomic concentration of the extrinsic ligand in the film of the TMO material prior to the exposing the at least the first portion of the film of the TMO material to the elevated temperature comprises between about 0.1% and about 50.0%.

25. A method of fabricating a correlated electron material (CEM) device, comprising:
    forming a film of a transition metal oxide (TMO) material over a substrate, the film of the TMO material comprising a first atomic concentration of an extrinsic ligand; and
    evaporating, in a chamber, a portion of the extrinsic ligand from at least a first portion of the film of the TMO material until the at least the first portion of the film of the TMO material is capable of switching between a relatively conductive state and a substantially dissimilar insulative state while maintaining at least a second portion of the film of the TMO material incapable of switching between the relatively conductive state and the substantially dissimilar state.

26. The method of claim 25, wherein the evaporating the portion of the extrinsic ligand from the at least the first portion of the film of the TMO material comprises exposing the at least the first portion of the film of the TMO material to a temperature of between about 900° C. to about 1500° C. for a duration of between about 0.5 µs and about 2.0 µs or for a duration of about 250 µs to about 2.0 seconds.

27. The method of claim 25, wherein the evaporating the portion of the extrinsic ligand from the at least the first portion of the film of the TMO material comprises exposing the at least the first portion of the film of the TMO material to one or more laser pulses having a duration of between 0.5 µs and 2.0 µs to provide a temperature between about 900.0° C. to about 1500.0° C. at the at least the first portion of the portion of the film of the TMO material.

28. The method of claim 25 wherein the evaporating the portion of the extrinsic ligand from the at least the first portion of the film of the TMO material comprises exposing the at least the first portion of the film of the TMO material utilizing one or more flashes of a flashlamp of between about 250.0 µs to about 2.0 seconds to provide a temperature of between about 900.0° C. to about 1500.0° C. at the at least the first portion of the film of the TMO material.

* * * * *